United States Patent
Morrow et al.

(10) Patent No.: US 7,056,813 B2
(45) Date of Patent: Jun. 6, 2006

(54) METHODS OF FORMING BACKSIDE CONNECTIONS ON A WAFER STACK

(75) Inventors: Patrick Morrow, Portland, OR (US); R. Scott List, Beaverton, OR (US); Sarah E. Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/071,434

(22) Filed: Mar. 2, 2005

(65) Prior Publication Data

US 2005/0164490 A1 Jul. 28, 2005

Related U.S. Application Data

(62) Division of application No. 10/665,824, filed on Sep. 17, 2003, now Pat. No. 6,897,125.

(51) Int. Cl.
*H01L 21/30* (2006.01)

(52) U.S. Cl. ............... 438/459; 438/455; 438/622; 438/652; 438/666; 438/672

(58) Field of Classification Search ........... 439/622, 439/652, 666, 672, 459, 977
See application file for complete search history.

(56) References Cited

U.S. PATENT DOCUMENTS

| | | | |
|---|---|---|---|
| 5,102,821 A | 4/1992 | Moslehi | |
| 5,373,184 A | 12/1994 | Moslehi | |
| 5,413,952 A | 5/1995 | Pages et al. | |
| 5,756,395 A * | 5/1998 | Rostoker et al. | ............ 438/622 |
| 5,849,627 A | 12/1998 | Linn et al. | |
| 5,866,469 A | 2/1999 | Hays | |
| 5,882,532 A | 3/1999 | Field et al. | |
| 6,380,629 B1 | 4/2002 | Kim | |
| 6,406,636 B1 | 6/2002 | Vaganov | |
| 2002/0001920 A1 | 1/2002 | Takisawa et al. | |
| 2002/0076902 A1 | 6/2002 | Guesic | |
| 2002/0160582 A1 | 10/2002 | Chen et al. | |
| 2002/0195673 A1 | 12/2002 | Chou et al. | |
| 2003/0060020 A1 | 3/2003 | Walitzki et al. | |
| 2003/0157748 A1 | 8/2003 | Kim et al. | |

OTHER PUBLICATIONS

Kobrinsky, et al., "Method and Structure For Interfacing Electronic Devices", U.S. Appl. No. 10/334,172, Filed Dec. 28, 2002, 39 pgs.

* cited by examiner

*Primary Examiner*—George Fourson
*Assistant Examiner*—Julio J Maldonado
(74) *Attorney, Agent, or Firm*—Kerry D. Tweet

(57) ABSTRACT

Various methods of forming backside connections on a wafer stack are disclosed. To form the backside connections, vias are formed in a first wafer that is to be bonded with a second wafer. The vias used for the backside connections are formed on a side of the first wafer along with an interconnect structure, and the backside connections are formed on an opposing side of the first wafer using these vias.

51 Claims, 26 Drawing Sheets

METHODS OF FORMING BACKSIDE CONNECTIONS ON A WAFER STACK

This application is a divisional of U.S. patent application Ser. No. 10/665,824, filed Sep. 17, 2003, now U.S. Pat. No. 6,897,125.

FIELD OF THE INVENTION

The invention relates generally to wafer bonding and, more particularly, to methods of forming backside connections on a wafer stack.

BACKGROUND OF THE INVENTION

Wafer bonding is the joining together of two or more semiconductor wafers upon which integrated circuitry has been formed to form a three-dimensional wafer stack. The wafer stack is subsequently diced into separate "stacked die," each stacked die having multiple layers of integrated circuitry. Wafer stacking technology offers a number of potential benefits, including improved form factors, lower costs, enhanced performance, and greater integration through "system-on-chip" solutions. System-on-chip (SOC) architectures formed by wafer stacking can enable high bandwidth connectivity of products—e.g., logic circuitry and dynamic random access memory (DRAM)—that otherwise have incompatible process flows. There are many applications for wafer stacking technology, including high performance processing devices, video and graphics processors, high density and high bandwidth memory chips, as well as the above-noted SOC solutions.

An example of a typical wafer stack 100 comprising two bonded wafers is illustrated in FIGS. 1A and 1B. A plan view of the wafer stack is shown in FIG. 1A, and a cross-sectional elevation view is shown in FIG. 11B. Referring to these figures, the wafer stack 100 includes a first wafer 101 and a second wafer 102, each of the wafers 101, 102 comprising a substrate 110, 120, respectively. The substrate 110, 120 of each wafer 101, 102 typically comprises a semiconductor material, such as Silicon (Si), Gallium Arsenide (GaAs), or SiGe. Integrated circuitry for a number of stacked die 105 has been formed on each of the wafers 101, 102, and the wafer stack 100 is ultimately cut into these separate stacked die 105. The integrated circuitry for each stacked die 105 includes a number of active devices 112 (e.g., transistors, capacitors, etc.) formed on the substrate 110 of first wafer 110 and a number of active devices 122 formed on the substrate 120 of second wafer 120.

Disposed over a surface of first wafer 101 is an interconnect structure 114, and disposed over a surface of the second wafer 102 is an interconnect structure 124. Generally, each of the interconnect structures 114, 124 comprises a number of levels of metalization, each layer of metalization separated from adjacent levels by a layer of dielectric material (or other insulating material) and interconnected with the adjacent levels by vias. The dielectric layers of interconnects 114, 124 are often each referred to as an "interlayer dielectric" (or "ILD"). The metalization on each layer comprises a number of conductors (e.g., traces) that may route signal, power, and ground lines to and from the integrated circuitry of each die 105, and this metalization comprises a conductive material, such as Copper or Aluminum. Formed on an uppermost ILD layer of interconnect 114 are conductors 116 and, similarly, formed on an uppermost ILD layer of interconnect 124 are conductors 126. The first and second wafers 101, 102 are bonded together by metal-to-metal bonds between the conductors 116, 126 on their uppermost interconnect layers, respectively. Alternatively, the first and second wafers 101, 102 may be bonded using an adhesive.

Ultimately, the wafer stack 100 will be cut into a number of separate stacked die, as noted above. To couple each stacked die with a next-level component (e.g., a package substrate, a circuit board, a motherboard, another integrated circuit device, a computer system, etc.), a number of leads are provided for each die. For a flip-chip type package—employing, for example, Controlled Collapse Chip Connection (or "C4") assembly techniques—the number of leads comprises an array of solder balls (or columns). The array of solder balls is electrically coupled with a mating array of leads (e.g., lands, pads, etc.) formed on the next-level component.

Construction of leads on the wafer stack 100 is illustrated in FIG. 1C. The first wafer 101 has been thinned down at a backside 111 of substrate 110, and a layer of dielectric material 150 has been deposited over the substrate's backside surface. A number of vias 113 have also been formed, each of the vias 113 extending through the dielectric layer 150 and wafer substrate 110 and, further, into the interconnect structure 114. A layer of dielectric material 117 (or other insulating material) has been formed on the walls of each via 113, and a conductive material (e.g., Copper) 118 has been deposited within each via 113 over dielectric layer 117. The conductive material 118 in each via 113 extends to one of the ILD layers of interconnect structure 114, where the conductive material forms electrical contact with one of a number of conductors 115 in that ILD layer. Leads 119 (e.g., solder balls or other connection elements) are then deposited on the conductive material 118 at the backside 111 of the first wafer 101, and these connection elements 105 along with conductive material 118 in vias 113 provide electrical connections to a next-level component.

Note that, in FIGS. 1B and 1C, only a limited number of active devices 112, 122, conductors 116, 126, and vias 113 (with conductive material 118 and leads 119) are shown for ease of illustration and clarity. However, those of ordinary skill in the art will appreciate that, in practice, the integrated circuitry associated with each stacked die 105 may include millions or even tens of millions of active devices 112, 122 and, further, that interconnect structures 114, 124 may include tens or even hundreds of conductors 116, 126 in their uppermost ILD layers, respectively. Similarly, those of ordinary skill in the art will appreciate that each stacked die 105 of wafer stack 100 will, in practice, include dozens of backside connections (e.g., vias 113 with conductive material 118 and leads 119).

As illustrated in FIG. 1C, at least some of the vias 113—and the conductive material 118 deposited therein—are misaligned relative to the conductors 115 in interconnect structure 114. This misalignment between vias 113 and conductors 115 results from a lack of precise alignment during formation of the vias 113. Due to the opaqueness of wafer substrate materials, as well as to equipment and process constraints, it is difficult to establish precise registration—and, hence, accurate alignment—between structures formed at the backside 111 of wafer 101 (e.g., vias 113) and structures formed on the wafer's opposing side (e.g., conductors 115 within interconnect structure 114). The misalignment between vias 113 and the conductors 115 of interconnect structure 114 may cause poor electrical connections to be formed between the conductors 115 and the conductive material 118 in vias 113, which can negatively affect device performance and lower production yields.

DETAILED DESCRIPTION OF THE INVENTION

Disclosed are embodiments of a method of forming backside connections on a wafer stack. In the disclosed embodiments, vias for backside connections are formed from a wafer's front side prior to bonding with a second wafer, and misalignment of the vias resulting from an inability to achieve adequate registration between features formed on opposing sides of the wafer is, therefore, minimized. Various embodiments of this method of forming backside connections on a wafer stack are disclosed in the block diagrams of FIGS. 2, 4A–4B and 6A–6B, respectively.

Figure 2:
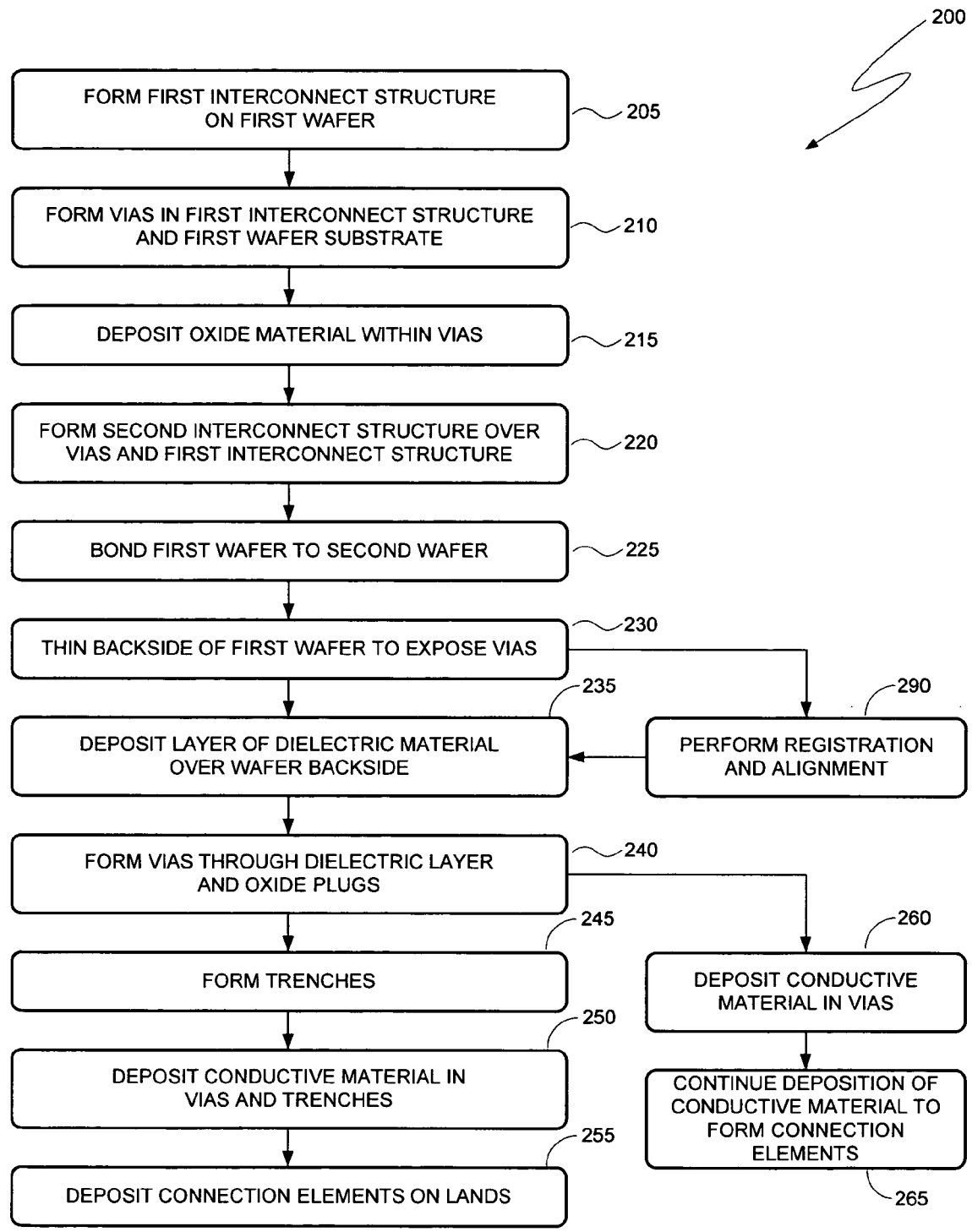
FIG. 2 is a block diagram illustrating an embodiment of a method of forming backside electrical connections on a wafer stack.

Turning now specifically to FIG. 2, illustrated is an embodiment of a method 200 of forming backside connections on a wafer stack. The embodiments of the method 200 shown in FIG. 2 are further illustrated in the schematic diagrams of FIGS. 3A through 3M, and reference should be made to these figures as called out in the text.

Figure 3A:
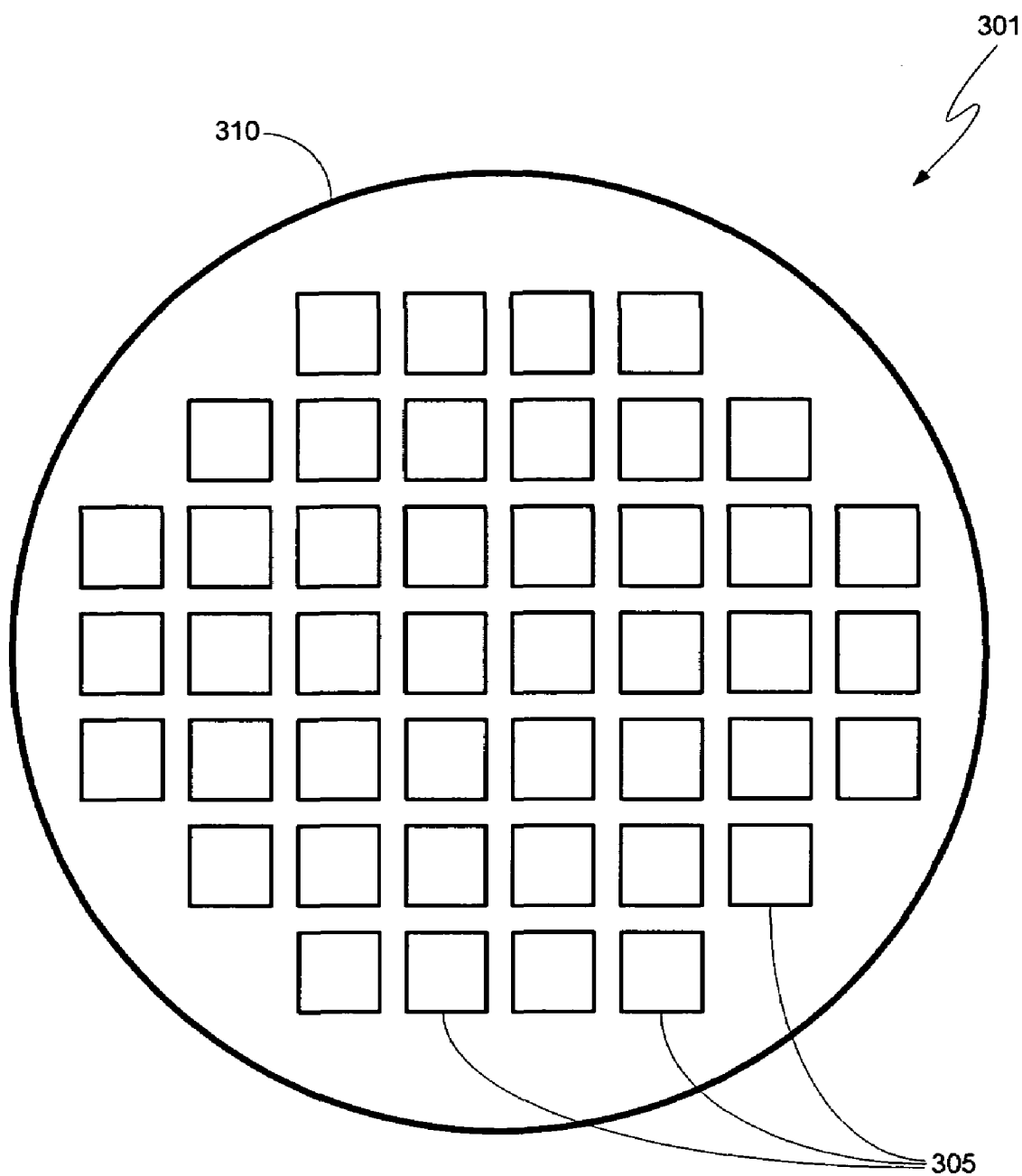
FIGS. 3A–3M are schematic diagrams illustrating embodiments of the method of forming backside electrical connections on a wafer stack, as shown in FIG. 1.
Figure 3B:
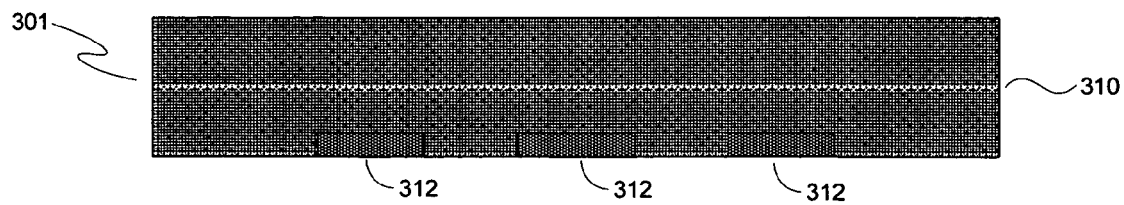

Referring initially to FIGS. 3A and 3B, a first wafer 301 is illustrated. A plan view of the wafer 301 is shown in FIG. 3A, and a cross-sectional elevation view of the wafer 301 is shown in FIG. 3B. First wafer 301 comprises a substrate 310 upon which integrated circuitry for a number of die 305 has been formed, each die 305 comprising one layer of a stacked die. The wafer 301 (or wafer stack, as described below) is ultimately cut into these separate devices. As shown in FIG. 3B, the integrated circuitry for each die 305 may include a number of active devices 312 (e.g., transistors, capacitors, etc.) formed on substrate 310. Wafer 301 is typically circular in shape, as shown in FIG. 3A, but may be of any suitable shape or configuration. In one embodiment, the substrate 310 comprises a Silicon substrate (e.g., a single-crystal Silicon substrate). However, it should be understood that the substrate 310 may comprise any other suitable semiconductor material, such as Silicon-on-Insulator (SOI), Gallium Arsenide (GaAs), Germanium (Ge), SiGe, etc.

Figure 3C:
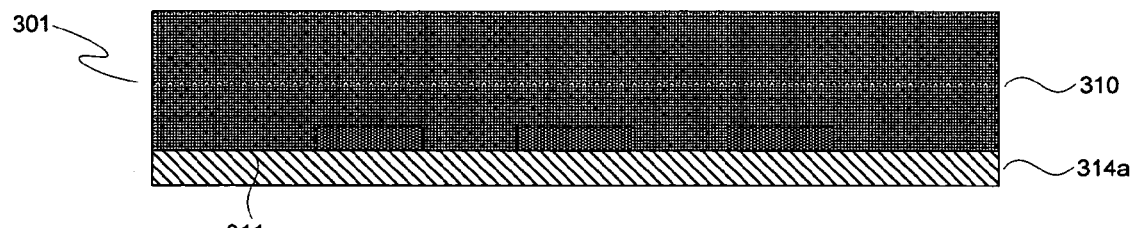

Referring to block 205 in FIG. 2, a first interconnect structure is formed on a first wafer. This is illustrated in FIG. 3C, where a first interconnect structure 314a has been formed on a "front" surface 311a of the first wafer substrate 310. Generally, the interconnect structure 314a comprises a number of levels of metalization, each layer of metalization separated from adjacent levels by a layer of dielectric material (or other insulating material) and interconnected with these adjacent levels by vias. The dielectric layers of interconnect 314a are often each referred to as an "interlayer dielectric" or "ILD", as noted above. In one embodiment, the ILD material comprises Silicon Dioxide ($SiO_2$). However, it should be understood that each ILD layer may comprise any other suitable dielectric or insulating material, such as SiOF, a Carbon-doped Oxide (CDO), a glass (e.g., a spin-on glass), or a polymer (e.g., a spin-on-polymer). The metalization on each layer comprises a number of conductors (e.g., traces) that may route signal, power, and ground lines to and from the integrated circuitry of each die 305, and this metalization comprises a conductive material. In one embodiment, this conductive material comprises Copper, but it should be understood that the metalization in interconnect structure 314a may comprise any other suitable conductive material, such as Aluminum (Al), Gold (Au), Silver (Ag), etc. First interconnect structure 314a may be constructed using any suitable fabrication methods, such as a dual damascene technique or a single damascene technique.

Figure 3D:
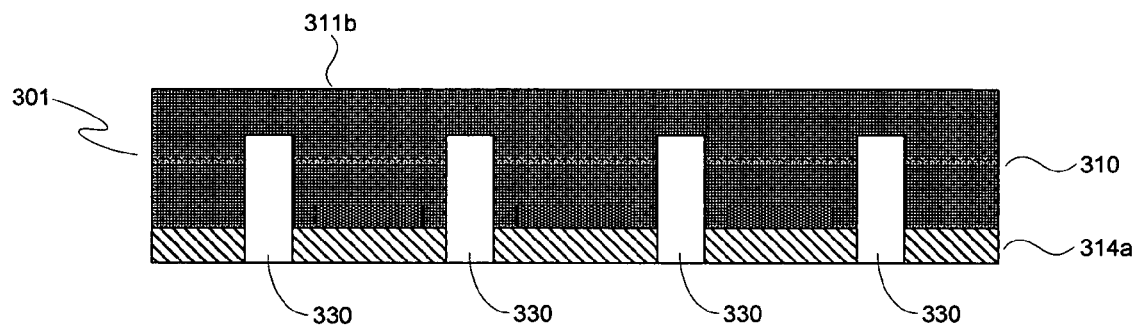

Referring to block 210 in FIG. 2, a number of vias are formed that extend through the first interconnect structure and into the first wafer. This is shown in FIG. 3D, where a number of vias 330 have been formed, each via 330 extending through the first interconnect structure 314a and into the first wafer substrate 310. The vias 330 extend into the substrate 310 to a depth wherein, upon thinning of substrate 310 at the wafer's backside 311b (described below in greater detail), the vias 330 will be exposed and visible from the backside 311b. The vias 330 will ultimately be used to form backside connections for the die 305 (or stacked die), as well be explained below. The vias 330 may be formed using any suitable photolithography and etching processes. In one embodiment, the vias 330 have a depth of between 5 μm and 35 μm. It will, however, be appreciated by those of ordinary skill in the art that the upper bound on the depth of vias 330 is generally a function (at least in part) of the aspect ratio that can be achieved by the equipment and processes employed and, further, that deeper vias may be achieved.

It should be noted that, in some instances, "dummy" vias may be formed through the first interconnect 314a and into first wafer substrate 310. Dummy vias, which will not be used to form backside electrical connections, are often formed at various selected locations in order to maintain process uniformity, and numerous dummy vias may be distributed across the first wafer 301. Thus, it should be understood that, ultimately, not all of the vias 330 are necessarily utilized for establishing backside electrical connections.

Figure 3E:
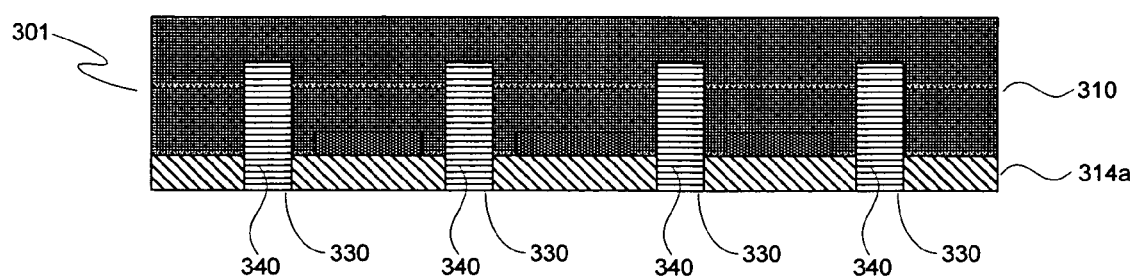

An oxide material (or other insulating material) is then deposited in each of the vias, as set forth at block 215. This is illustrated in FIG. 3E, where an oxide material 340 has been deposited in each of the vias 330, this oxide material 340 forming an "oxide plug." The oxide material 340 may comprise any suitable oxide or other insulating material that can be deposited over the ILD material in first interconnect 314a and over the material of wafer substrate 310. The oxide material 340 should also be amenable to etching, such that a via can be formed within each oxide plug, as will be described below in greater detail. In one embodiment, the oxide material comprises $SiO_2$. However, it should be understood that the oxide material may comprise any other suitable oxide material (e.g., SiOF) and, further, that the plugs 340 may comprise other insulating materials, including nitrides such as Silicon Nitride ($Si_3N_4$), carbides such as SiC, as well as polymer materials. The oxide material 340 may be deposited using any suitable deposition technique. In one embodiment, the oxide material is deposited using a blanket deposition technique, such as chemical vapor deposition (CVD), sputtering, or another thin film deposition technique. A subsequent planarization process (e.g., chemical mechanical polishing, or CMP) or an etching process is performed to remove excess oxide material from surfaces of the uppermost ILD layer in the first interconnect structure 314a, leaving the oxide material in vias 330. In another embodiment, the oxide plugs are deposited in the vias 330 using a selective deposition technique.

Figure 3F:
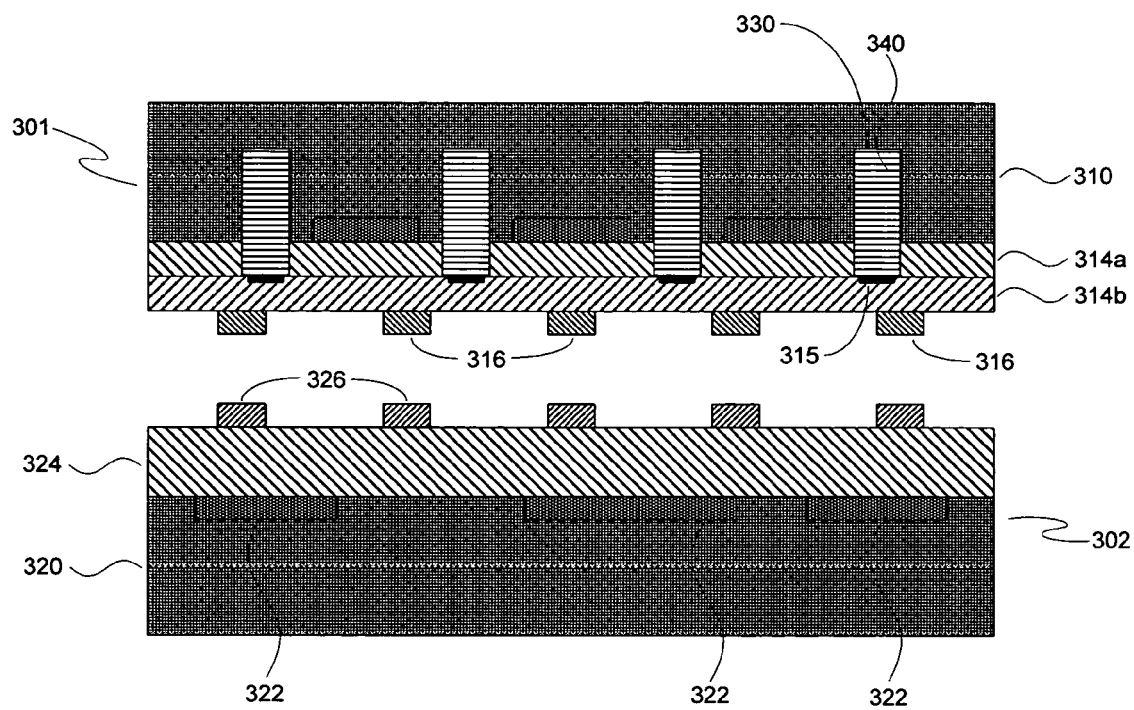

As set forth at block 220, a second interconnect structure is formed over the first interconnect structure and the vias. This is illustrated in FIG. 3F, where a second interconnect structure 314b has been formed over the first interconnect structure 314a, as well as over the vias 330 and oxide plugs 340. The second interconnect structure 314b may be similar to first interconnect structure 314a, and second interconnect structure 314b generally comprises a number of levels of metalization, wherein each layer of metalization is separated from adjacent levels by a layer of dielectric material (or other insulating material) and is interconnected with these adjacent levels by vias. In one embodiment, the ILD layers of second interconnect 314b comprise $SiO_2$, but in other embodiments, the ILD layers comprise another suitable dielectric or insulating material, such as SiOF, CDO, a glass, or a polymer. The metalization on each layer comprises a number of conductors (e.g., traces) that may route signal, power, and ground lines to and from the integrated circuitry of each die 305, and in one embodiment, the metalization comprises Copper. However, in other embodiments, the metalization comprises another suitable conductor, such as Aluminum, Gold, Silver, etc. Second interconnect structure 314b may be constructed using any suitable fabrication methods (e.g., dual damascene, single damascene, etc.). Note that the vias 330 and oxide plugs 340—and, ultimately, the backside electrical connections for the wafer stack—may extend to any desired ILD layer in the interconnect structure (i.e., first and second interconnect structures 314a, 314b) of the first wafer 301.

As shown in FIG. 3F, the metalization in second interconnect structure 314b includes conductors 315. Each conductor 315 is disposed on an ILD layer of second interconnect structure 314b that is adjacent to one of the oxide plugs 340, and each conductor 315 is in contact with (or at least in close proximity with) the oxide plugs 340. The conductors 315, in conjunction with vias that are to be formed through oxide plugs 340, as explained below, will be used to form backside electrical connections for each die (or stacked die) 305. Because the second interconnect structure 314b and conductors 315 are formed from the same side of wafer 301 as the vias 330 and oxide plugs 340 (i.e., the front side 311a), registration and alignment between conductors 315 and the oxide plugs 340 is readily achieved. As noted above, in some conventional wafer bonding processes, backside connections are formed by creating vias from the opposing side (i.e., the "back" side) of the wafer, wherein it is difficult to achieve alignment between these vias and structures on the wafer's front side. The metalization in second interconnect structure 314b also includes conductors 316 formed on an uppermost ILD layer thereof. The conductors 316 will be used for bonding the first wafer 201 with a second wafer, as is also described below.

Also shown in FIG. 3F is a second wafer 302 that is to be bonded with the first wafer 301. Second wafer 302 comprises a substrate 320 upon which integrated circuitry for a number of die (i.e., a number of die corresponding to the number of die 305 on first wafer 301) has been formed, each die comprising one layer of a stacked die. The integrated circuitry for each die on second wafer 302 may include a number of active devices 322 (e.g., transistors, capacitors, etc.) formed on substrate 320. The first and second wafers 301, 302 will be joined to create a wafer stack, as described below, and this wafer stack may ultimately be cut into a plurality of separate stacked die. Each of the singulated stacked die may then be packaged (e.g., attached to a package substrate, coupled with a heat sink, encapsulated, etc.) to form a packaged integrated circuit device.

Second wafer 302 is typically circular in shape (e.g., see FIG. 3A), but may be of any suitable shape or configuration. In one embodiment, the first and second wafers 301, 302 have the same shape; however, in another embodiment, these wafers have differing shapes and/or configurations. In one embodiment, the substrate 320 of second wafer 302 comprises a Silicon substrate (e.g., a single-crystal Silicon substrate), but it should be understood that the substrate 320 may comprise any other suitable semiconductor material (e.g., SOI, GaAs, Ge, SiGe, etc.). In one embodiment, the first and second wafers 301, 302 comprise the same material, and in a further embodiment, the first and second wafers 301, 302 comprise different materials. Also, although the wafers 301, 302 may be fabricated using substantially the same process flow, in another embodiment, the wafers 301, 302 are fabricated using different process flows. In one embodiment, one of the wafers (e.g., wafer 301) includes logic circuitry formed using a first process flow, and the other wafer (e.g., wafer 302) includes memory circuitry (e.g., DRAM, SRAM, etc.) that is formed using a second, different process flow. Thus, as will be appreciated by those of ordinary skill in the art, the disclosed embodiments are applicable to any type of wafer or combination of wafers—irrespective of size, shape, material, architecture, and/or process flow—and, as used herein, the term "wafer" should not be limited in scope to any particular type of wafer or wafer combination.

Disposed over a surface of the second wafer's substrate 320 is an interconnect structure 324. Generally, the interconnect structure 324 comprises a number of levels of metalization, each layer of metalization separated from adjacent levels by an ILD layer and interconnected with these adjacent levels by vias. In one embodiment, the ILD material in interconnect 324 comprises Silicon Dioxide ($SiO_2$); however, it should be understood that each ILD layer may comprise any other suitable dielectric or insulating material (e.g., SiOF, CDO, a glass, or a polymer). The metalization on each layer comprises a number of conductors (e.g., traces) that may route signal, power, and ground lines to and from the integrated circuitry of each die on wafer 302. In particular, the metalization in interconnect structure 324 includes conductors 326 formed on an uppermost ILD layer thereof, and the conductors 326 will be used for bonding the second wafer 302 with first wafer 301, as suggested above. The metalization of interconnect 324 comprises a conductive material, and in one embodiment, this conductive material comprises Copper. However, in other embodiments, the metalization comprises another suitable conductive material (e.g., Aluminum, Gold, Silver, etc.). The interconnect structure 324 may be constructed using any suitable fabrication methods, such as a dual damascene technique or a single damascene technique.

At this juncture, it should be noted that, in each of FIGS. 3B through 3F (as well as FIGS. 3G–3M, 5A–5O, and 7A–7K), only a limited number of active devices 312, 322, vias 330 (and oxide plugs 340), and conductors 316, 326 are shown for ease of illustration and clarity. However, as will be appreciated by those of ordinary skill in the art, the integrated circuitry associated with each die of both wafers 301, 302 may, in practice, include tens of millions, or even hundreds of millions, of active devices 312, 322 and, further, that interconnect structures 314b, 324 may include several hundred of the conductors 316, 326 in their uppermost ILD layers, respectively. Similarly, those of ordinary skill in the art will appreciate that each stacked die to be formed from wafers 301, 302 may, in practice, include hundreds of backside connections (e.g., which are to be formed at vias 330). Thus, it should be understood that FIGS. 3B through 3F (and FIGS. 3G–3M, 5A–5O, and 7A–7K) are simplified schematic representations of the wafers 301, 302 presented merely as an aid to understanding the disclosed embodiments and, further, that no unnecessary limitations should be drawn from these schematic representations.

Figure 3G:
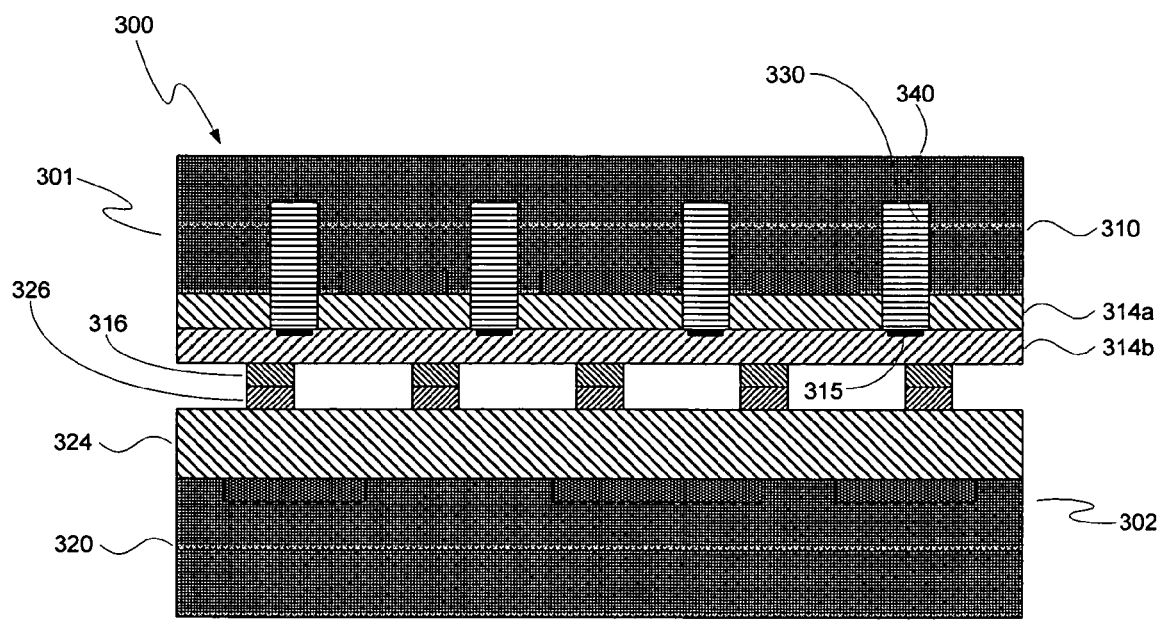

Referring now to block 225 in FIG. 2, the first wafer is bonded to a second wafer. This is illustrated in FIG. 3G, where the first wafer 301 has been bonded with the second wafer 302 to form a wafer stack 300. The first and second wafers may be aligned and bonded together using any suitable bonding apparatus and using any suitable joining process. In one embodiment, the first and second wafers 301, 302 are joined by metal-to-metal bonds formed between the conductors 316 on the uppermost ILD layer of first wafer 301 and the conductors 326 on the uppermost ILD layer of second wafer 302, as shown in FIG. 3G. The metal-to-metal bonds (e.g., Copper-to-Copper bonds) between the conductors 316, 326 may be created using any suitable bonding technique (e.g., diffusion bonding). In another embodiment, the first and second wafers 301, 302 are bonded together using an adhesive bonding process.

Figure 3H:
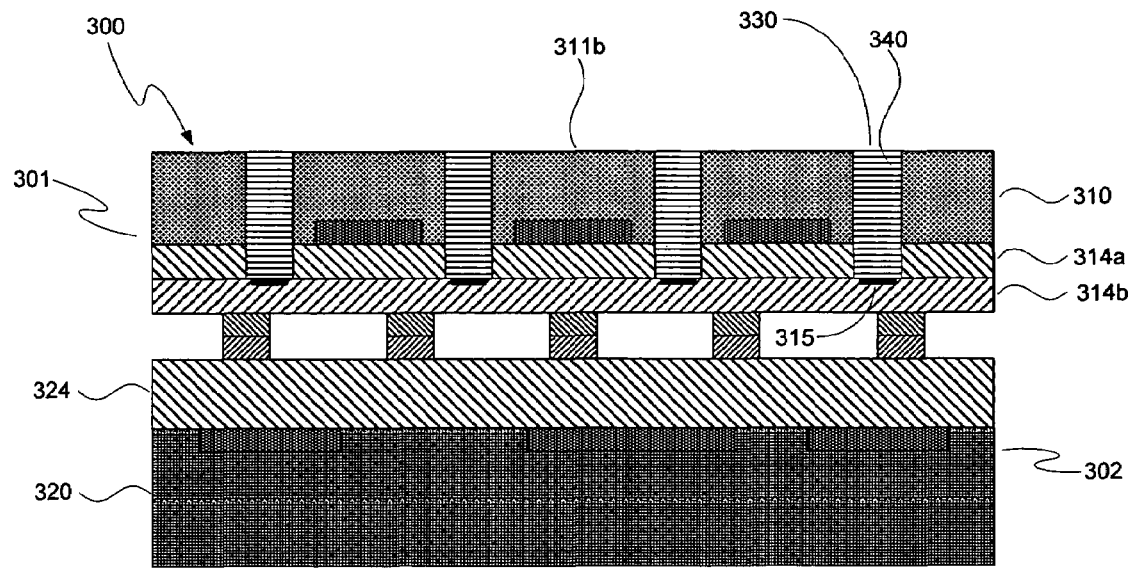

As set forth at block 230, the backside of the first wafer is thinned down to expose the vias and oxide plugs. This is illustrated in FIG. 3H, where the first wafer 301 has been thinned down at the wafer's backside 311b, thereby exposing the vias 330 and oxide plugs 340 in substrate 310. Any suitable process may be employed to thin the backside 311b of first wafer 301, including chemical mechanical polishing (CMP), grinding, or etching.

Figure 3I:
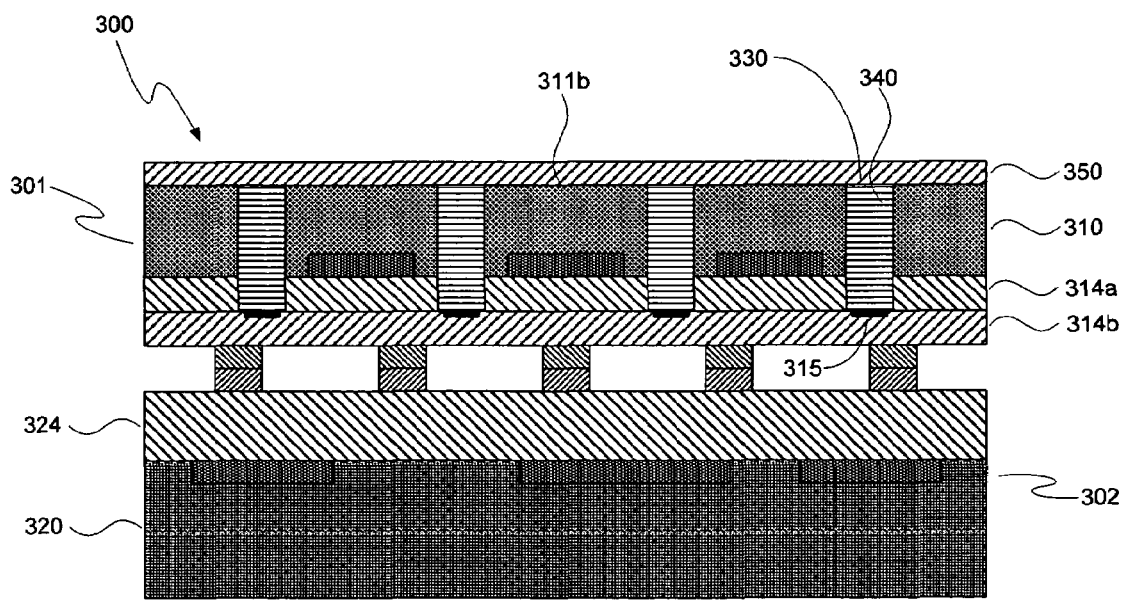

With reference to block 235, a layer of dielectric material is deposited over the first wafer's backside and the oxide plugs. This is shown in FIG. 3I, where a layer of dielectric material 350 has been formed over the first wafer's backside 311b and the oxide plugs 340. The dielectric layer 350 functions as an insulating and/or barrier layer between the first wafer's substrate 310 and the backside connections that are to be formed on the wafer stack 300, as will be explained in greater detail below. In one embodiment, the dielectric material 350 comprises an oxide (e.g., $SiO_2$). However, it should be understood that the dielectric material may comprise any other suitable insulating material, such as a nitride (e.g., $Si_3N_4$) or a carbide (e.g., SiC). The dielectric material may be deposited using any suitable thin-film deposition technique, such as CVD, spin-on, or sputtering, as well as others.

Figure 3J:
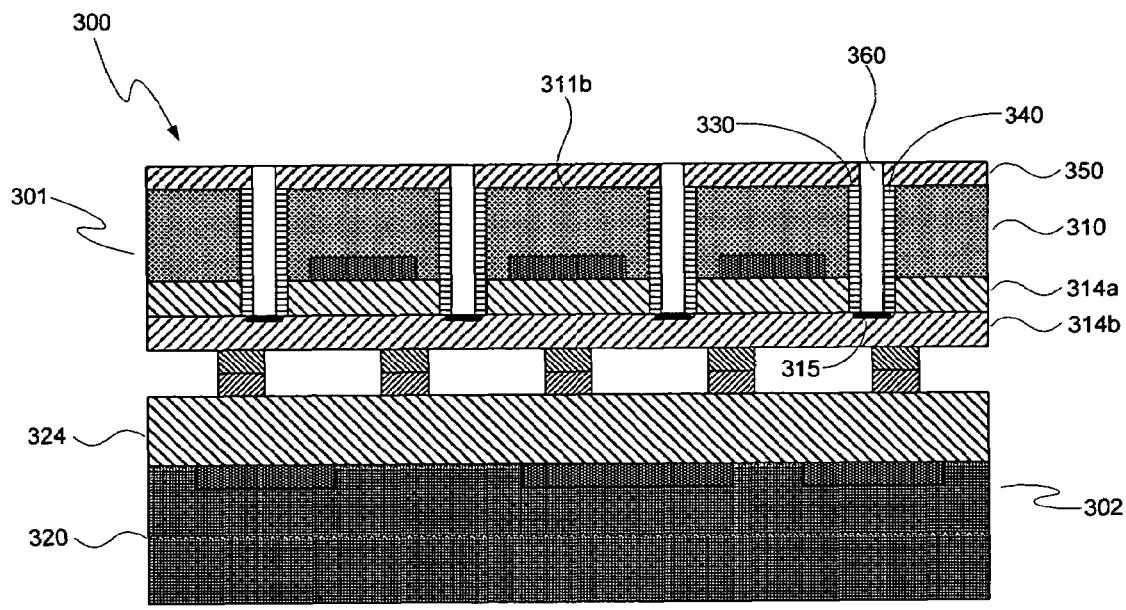

As set forth at block 240, vias are then formed through the dielectric layer and the oxide plugs. This is illustrated in FIG. 3J, where a number of vias 360 has been formed, each via 360 extending through the dielectric layer 350 and, further, through one of the oxide plugs 340. The walls of each via 360 comprise the oxide material 340 deposited in the outer vias 330 that were originally formed from the first wafer's front side (i.e., the portion of oxide plugs 340 not removed during formation of vias 360). Each via 360 extends down through its corresponding oxide plug 340 to one of the conductors 315 in the second interconnect structure 314b. Any suitable photolithography and etching processes may be employed to create the vias 360.

Note that, after thinning of the first wafer 301, the vias 330 and oxide plugs 340 will be visible from the first wafer's backside 311b. These visible oxide plugs 340 and vias 330 can be used by the processing equipment for registration and alignment. Thus, in one embodiment, after thinning of the first wafer's backside, the visible features (e.g., vias 330 and/or plugs 340) exposed by wafer thinning are used by the processing equipment to perform registration and alignment, as set forth at block 290. Accordingly, alignment of the first wafer 301 (or wafer stack 300) within the processing equipment can take place prior to formation of the vias 360 and, therefore, alignment between the vias 360 and the oxide plugs 340 (and underlying vias 330) is readily achieved. As used herein, "registration" is a process of locating a feature (e.g., a via 330 and/or oxide plug 340) that identifies a known reference point, or "home" position, on the workpiece (i.e., wafer 301 or wafer stack 300), and "alignment" is a process of aligning the processing equipment to that reference point with a desired degree of accuracy.

Figure 3K:
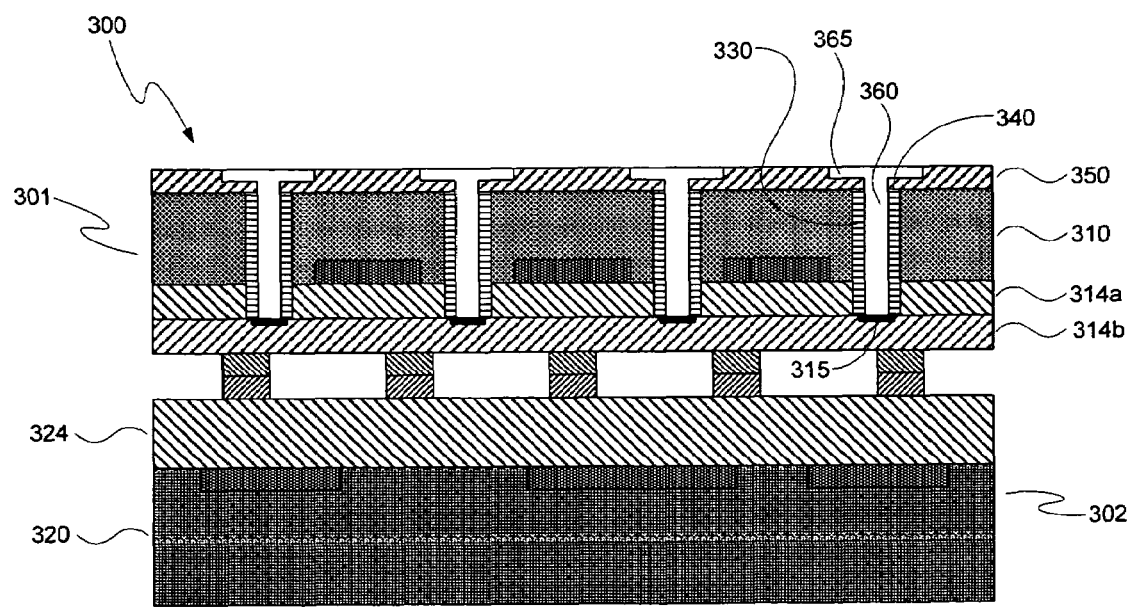

In one embodiment, after formation of the vias extending through the dielectric layer and oxide plugs, trenches for lands (or other connection pads) are formed, as set forth at block 245. This is illustrated in FIG. 3K, where trenches 365 for lands have been formed. Each trench 365 is generally located coincident with one of the vias 360, and the trenches 365 will subsequently be filled with a conductive material to form lands (to receive connection elements), as will be described below. Trenches 365 may be formed using any suitable photolithography and etching processes. In an alternative embodiment, the trenches 365 are formed prior to formation of the vias 360.

Figure 3L:
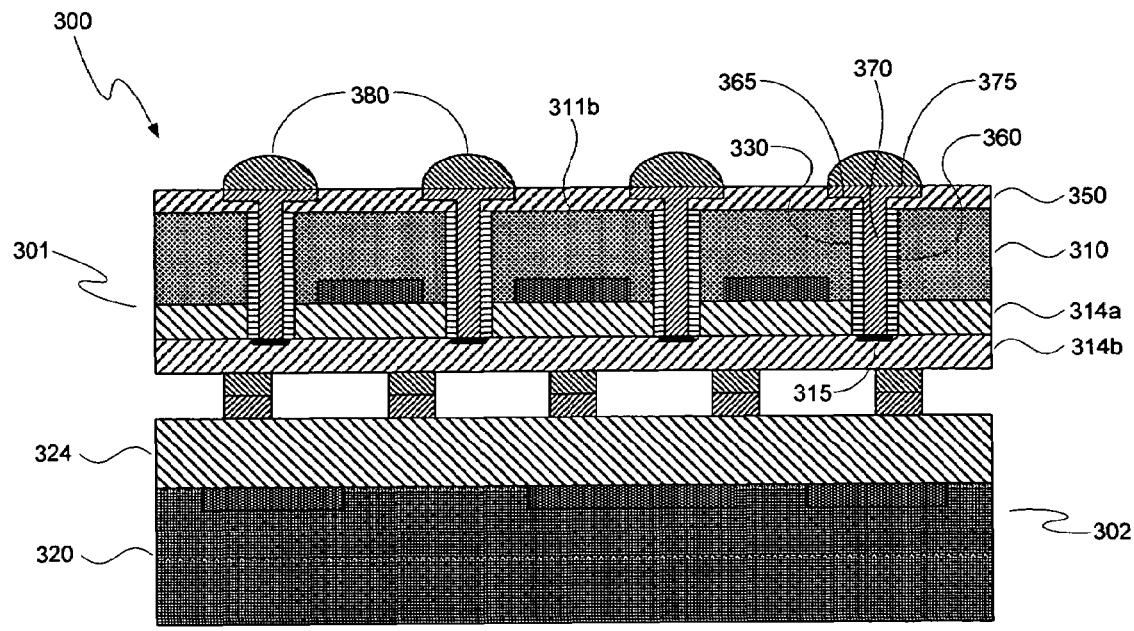

Referring next to block 250, a conductive material is deposited in each of the vias and trenches. This is shown in FIG. 3L, where a conductive material 370 has been deposited in each of the vias 360 and, further, within each of the trenches 365 to form a land 375. The conductive material 370 may comprise any conductive material that can be deposited on the oxide material 340 and the dielectric material 350 and, further, that can be electrically coupled with the conductors 315 in second interconnect structure 314b. In one embodiment, the conductive material 370 comprises Copper. However, it should be understood that any suitable conductive material can be deposited in the vias 360 and, in other embodiments, the conductive material 370 comprises another suitable conductor, such as Aluminum, Gold, Silver, etc. The conductive material 370 may be deposited using any suitable deposition technique. In one embodiment, the conductive material is deposited using a blanket deposition technique, such as CVD, sputtering, or other thin film deposition technique. A planarization process (e.g., CMP) or an etching process is then performed to remove excess conductive material from surfaces of the dielectric layer 350. In another embodiment, the conductive material is deposited in the vias 360 using a selective deposition technique (e.g., electroplating, electroless plating, etc.).

Connection elements are then deposited on the lands, as set forth at block 255. This is also illustrated in FIG. 3L, which shows connection elements 380 disposed on the conductive material 370 of lands 375. Connection elements 380 may comprise any suitable leads, such as spherical balls, columns, and the like. In one embodiment, the connection elements 380 comprises an array of conductive balls or columns providing for a flip-chip, C4 connection scheme.

The connection elements 380 may comprise any suitable conductive material that is deposited using any suitable process. For example, the connections elements 380 may comprise a solder (e.g., a Lead (Pb) and Tin (Sn) alloy), Copper, or Tin. When the wafer stack 300 is ultimately cut into separate stacked die, the connection elements 380 enable each stacked die to be connected with a next-level component (e.g., a package substrate, a circuit board, a motherboard, another integrated circuit device, a computer system, etc.).

In an alternative embodiment, the connection elements 380 are formed by continued deposition of the conductive material 370 (i.e., the connection elements 380 comprise the same conductive material as is deposited in the vias 360 and trenches 370). In this embodiment, a mask layer is deposited over the dielectric layer 350, and the conductive material 370 is deposited using a blanket deposition technique, such as CVD, sputtering, or other thin film deposition technique. An etching process is then performed to remove excess conductive material (and the mask layer) from surfaces of the dielectric layer 350. For this embodiment, the conductive material 370 may again be deposited using a selective deposition technique (e.g., electroplating, electroless plating, etc.).

Figure 3M:
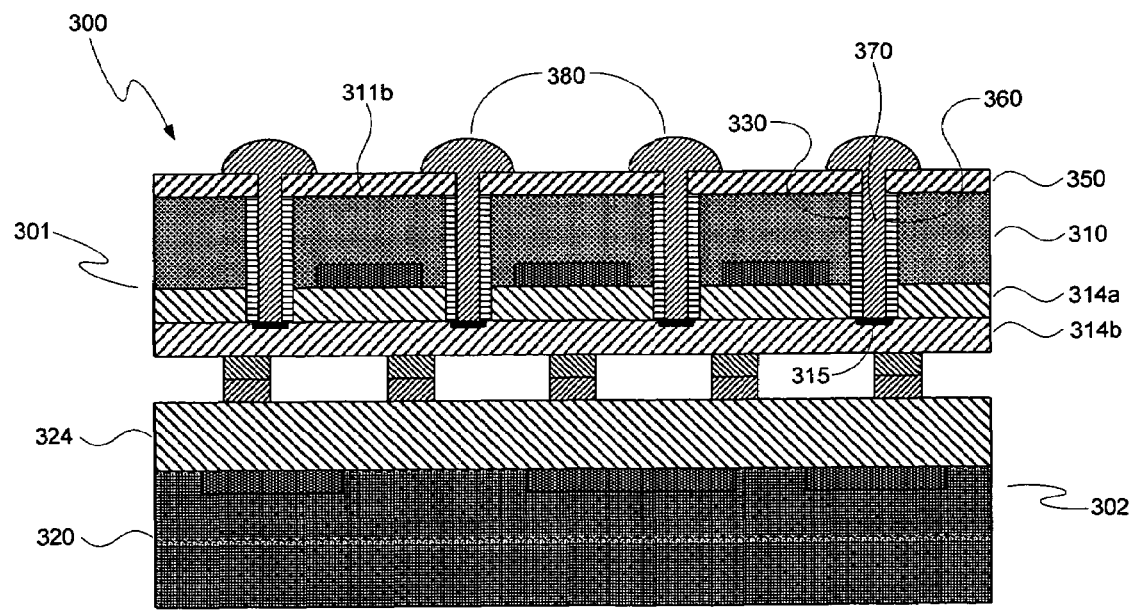

In another embodiment of the method 200, which is set forth at blocks 260 and 265 in FIG. 2, after formation of vias through the dielectric layer and oxide plugs, conductive material is simply deposited in the vias (i.e., no trenches and lands are formed), which is set forth at bock 260. This is illustrated in FIG. 3M, where a conductive material 370 has been deposited in each of the vias 360. Again, the conductive material 370 may comprise any conductive material that can be deposited on the dielectric material 350 and the oxide material 340 and, further, that can be electrically coupled with the conductors 315 in second interconnect structure 314b. In one embodiment, the conductive material 370 comprises Copper, but it should be understood that any suitable conductive material can be deposited in the vias 360 and, in other embodiments, the conductive material 370 comprises another suitable conductor (e.g., Aluminum, Gold, Silver, etc.). Deposition of the conductive material 370 is then continued to form connection elements, which is set forth at block 265. This is also illustrated in FIG. 3M, which shows connection elements 380 formed from the conductive material 370. As previously described, the connection elements 380 may comprise any suitable leads and, in one embodiment, the connection elements 380 comprises an array of conductive balls or columns providing for a flip-chip, C4 connection scheme. The conductive material 370 may be deposited using any suitable deposition technique. In one embodiment, a mask layer (not shown in FIG. 3M) is deposited on the dielectric layer 350, and the conductive material is deposited using a blanket deposition technique, such as CVD, sputtering, or other thin film deposition technique. After film deposition, an etching process is performed to remove excess conductive material (and the mask layer) from the dielectric layer 350. In another embodiment, the conductive material 370 is deposited in the vias 360 using a selective deposition technique (e.g., electroplating, electroless plating, etc.).

In each of FIGS. 3L and 3M (as well as FIGS. 5I, 5J, and 5O and FIGS. 7F, 7G, and 7K), each connection element 380 is illustrated as being coupled with a single land 375 and/or a single via 360 (filled with conductive material 370). In one embodiment, each of the connection elements 380 may have a dimension (e.g., diameter) on the order of 100 μm, whereas the vias 360 may have a dimension (e.g., diameter) on the order of 5 to 10 μm. Thus, although each connection element is shown in the figures as being coupled with one via, it should be understood that, in practice, a connection element 380 may be coupled with multiple conductor-filled vias 360 (either with or without lands).

Figure 4A:
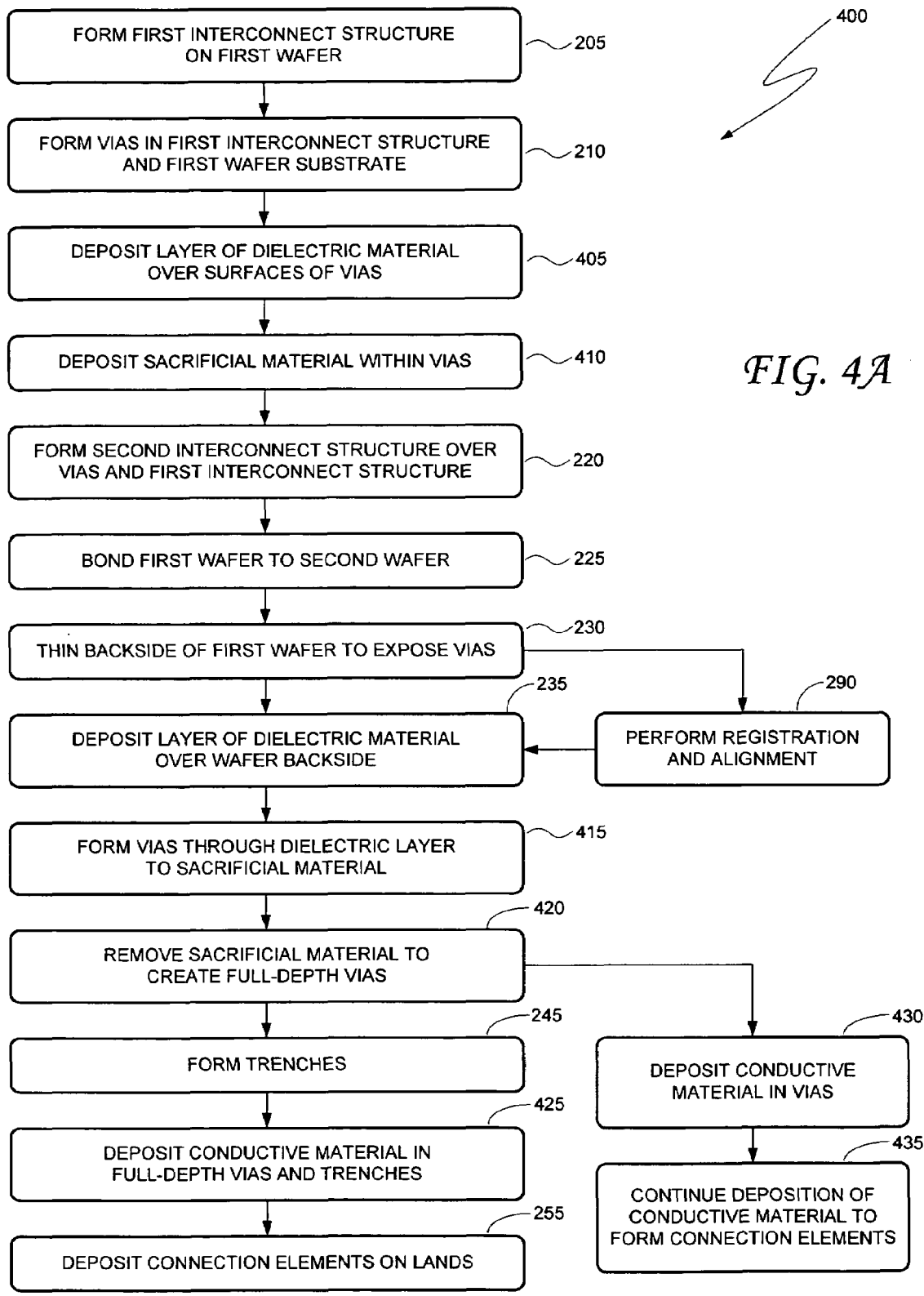
FIGS. 4A–4B are block diagrams illustrating another embodiment of a method of forming backside electrical connections on a wafer stack.
Figure 4B:
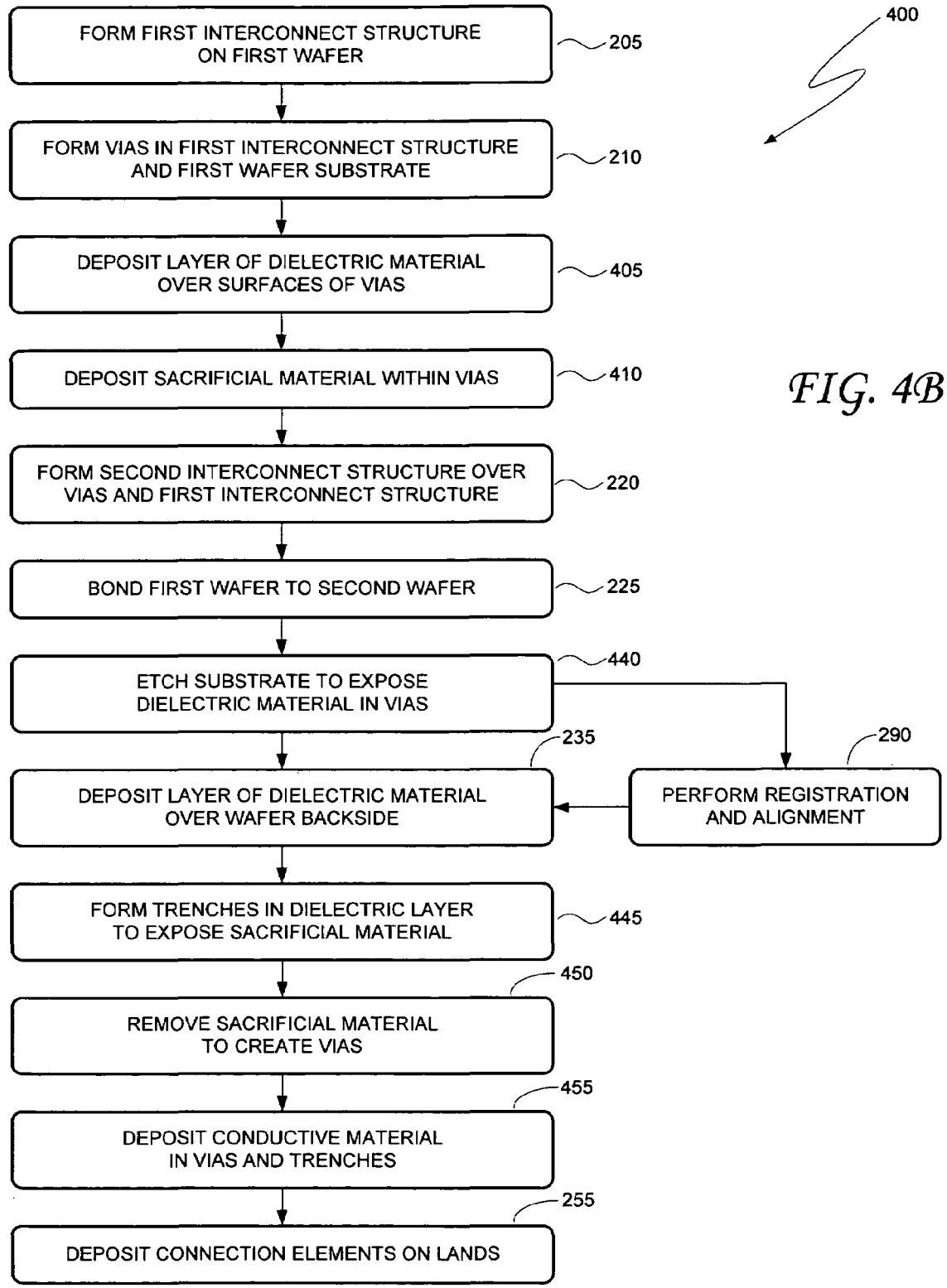
Figure 5A:
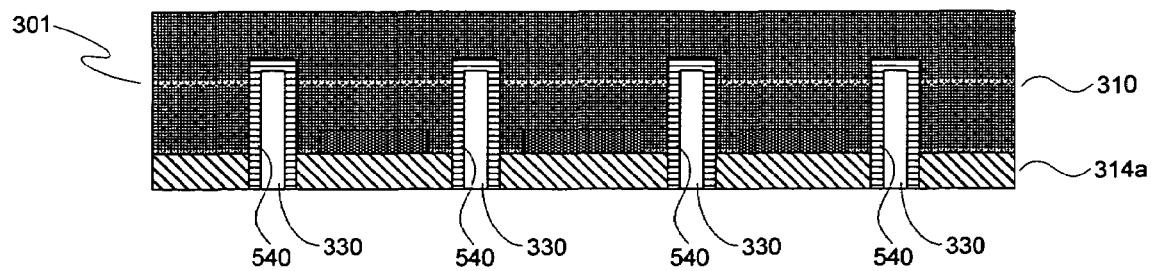
FIGS. 5A–5O are schematic diagrams illustrating embodiments of the method of forming backside electrical connections on a wafer stack, as shown in FIGS. 4A–4B.

Turning now to FIGS. 4A and 4B, illustrated is another embodiment of a method 400 of forming backside connections on a wafer stack. The embodiments of the method 400 shown in FIGS. 4A and 4B are further illustrated in the schematic diagrams of FIGS. 5A through 5O, and reference should be made to these figures as called out in the text. It should be noted that many of the blocks shown in the block diagrams of FIGS. 4A and 4B recite features that are the same as features recited in a corresponding block of FIG. 2, and like reference numerals are used in each of FIGS. 4A and 4B to identify like features. Similarly, many of the elements shown in the schematic diagrams of FIGS. 5A–5O are the same as those shown in FIGS. 3A–3M, and like reference numerals are used in each of FIGS. 5A–5O to reference like elements. Also, in some instances, a description of features or elements previously described may not be repeated in the following text.

Referring first to the embodiment of FIG. 4A and, in particular, to block 405 in this figure, after formation of the first interconnect structure 314a on first wafer 310 (see block 205) and, further, after formation of the vias 330 extending through the first interconnect 314a and into the first wafer substrate 310 (see block 210), both as described above, a layer of dielectric material is deposited over surfaces of the vias. This is illustrated in FIG. 5A, where a dielectric material 540 has been deposited on the walls each via 330. Dielectric layer 540 functions as an insulating and/or barrier layer for a sacrificial material (and, ultimately, a conductive material) that is to be deposited in the vias 330. The dielectric material comprises any suitable dielectric or insulating material that can be deposited on the ILD material of first interconnect 314a and that can be deposited on the material of first wafer substrate 310. In one embodiment, the dielectric material 540 comprises an oxide (e.g., $SiO_2$). However, it should be understood that the dielectric material 540 may comprise any other suitable insulating material, such as a nitride (e.g., $Si_3N_4$) or a carbide (e.g., SiC). The dielectric material 540 may be deposited using any suitable deposition technique. In one embodiment, the dielectric material is deposited using a blanket deposition technique, such as CVD, sputtering, or other thin film deposition technique. A subsequent planarization process (e.g., CMP) or an etching) process is performed to remove excess dielectric material from surfaces of the uppermost ILD layer in the first interconnect structure 314a. In another embodiment, the dielectric material is deposited over surfaces of the vias 330 using a selective deposition technique.

Figure 5B:
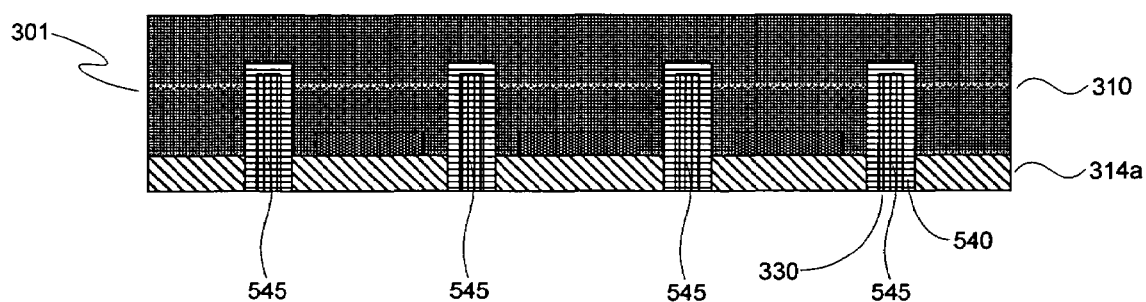

Referring to block 410, a sacrificial material is then deposited within each of the vias. This is illustrated in FIG. 5B, which shows a sacrificial material 545 deposited within each via 330 over the layer of dielectric material 540. Sacrificial material 545 will ultimately be removed from the vias 330 after wafer thinning, as will be described below. In one embodiment, the sacrificial material 545 has two characteristics. First, the sacrificial material 545 should have a glass transition temperature above those temperatures (e.g., 450° C.) that the sacrificial material will experience in downstream processing (prior to removal). Secondly, the sacrificial material 545 should have a much faster etch rate in the chemical etch solution (used to remove it) than the dielectric material 540 deposited on the walls of vias 330. In one embodiment, the sacrificial material comprises a glass— e.g., a spin-on-glass, such as Accuglass™ (a registered mark of Honeywell Int'l Inc.)—and in another embodiment, the sacrificial material comprises a polymer—e.g., a spin-on-polymer, such as SiLK™ (a registered mark of the Dow Chemical Co.). The sacrificial material 545 may be deposited using any suitable technique. In one embodiment, the sacrificial material is deposited using a blanket deposition technique—such as the spin-on process suggested above, as well as CVD or sputtering—and a subsequent planarization or etching process is performed to remove excess sacrificial material from surfaces of the uppermost ILD layer in the first interconnect structure 314a. However, in other embodiments, the sacrificial material is deposited over the dielectric layer 540 within each via 330 using a selective deposition technique.

Figure 5C:
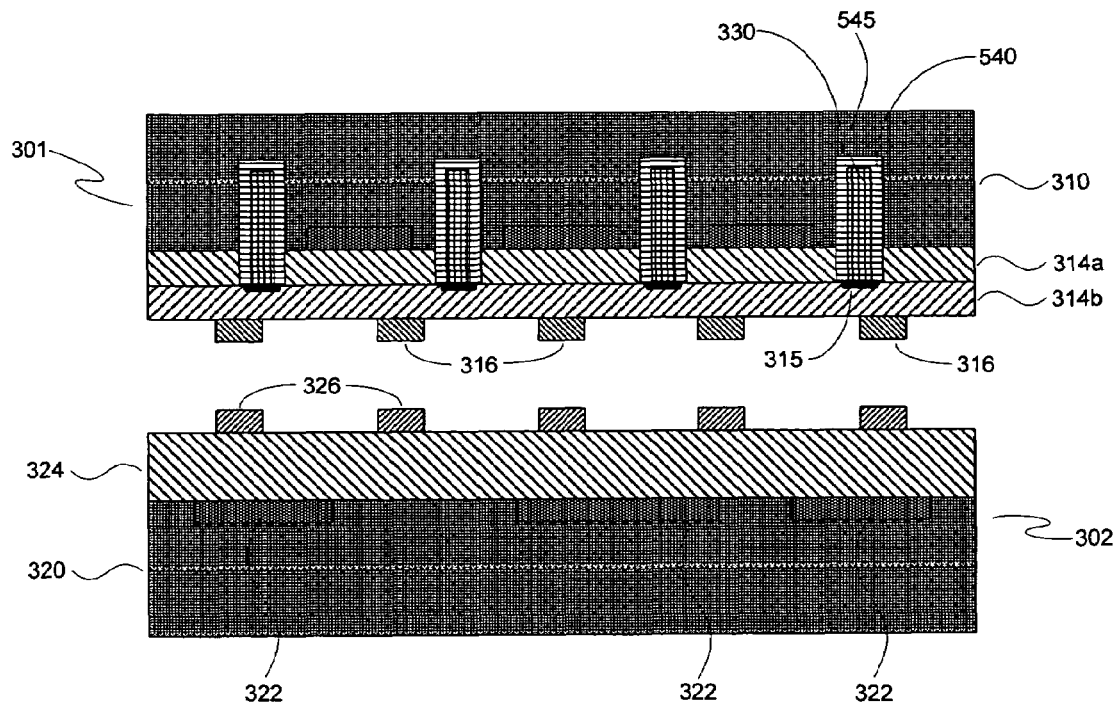
Figure 5D:
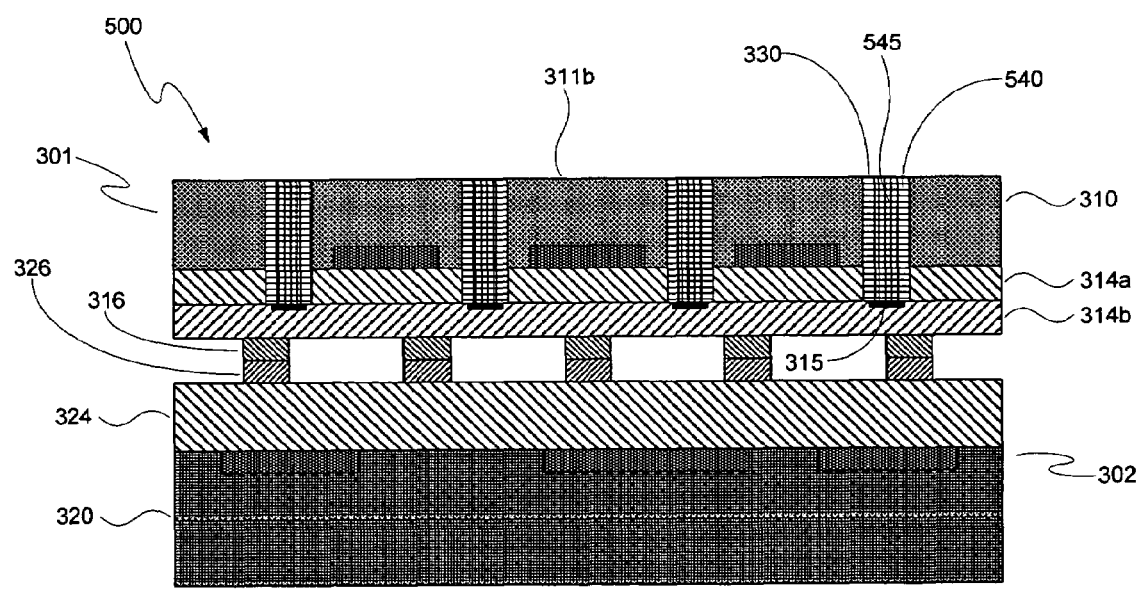

After deposition of the sacrificial material, the second interconnect structure 314b is formed (see block 220), as described above. This is illustrated in FIG. 5C. Note that, as shown in FIG. 5C, each conductor 315 of second interconnect 314b is in contact with (or at least in close proximity with) the sacrificial material 545 in one of the vias 330. The first and second wafers 301, 302 are then bonded (see block 225) to form a wafer stack 500, as previously described, and this is illustrated in FIG. 5D. Also as described above, thinning of the backside 311b of the first wafer is performed (see block 230) to expose the vias 330, as well as sacrificial material 545 and dielectric layer 540, which is also illustrated in FIG. 5D.

Figure 5E:
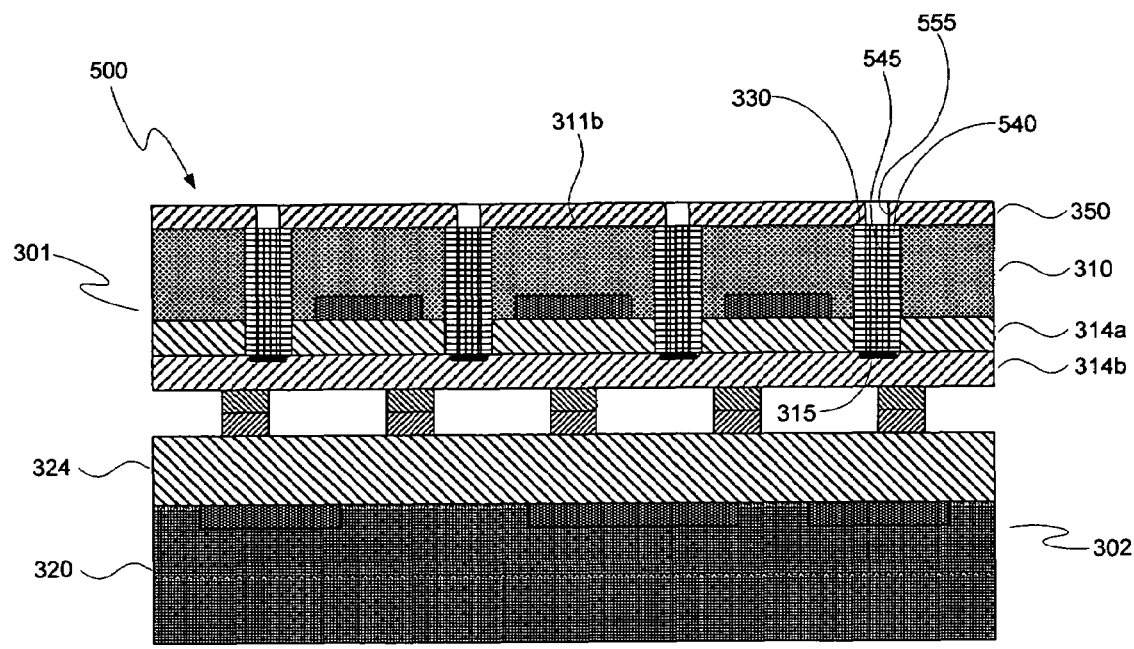

After wafer thinning, a layer of dielectric material 350 is deposited on the first wafer's backside 311b (see block 235), as previously described, and this is illustrated in FIG. 5E. Referring to block 415, vias are then formed through the dielectric layer that extend to the sacrificial material. This is also illustrated in FIG. 5E, where a number of vias 555 has been formed, each via 555 extending through the dielectric layer 350 and to the sacrificial material 545 that was deposited in the original vias 330. The vias 555 in dielectric layer 350—each via 555 being generally coincident with one of the vias 330 (and sacrificial material 545)—will be used for backside connections, as will be explained below. Any suitable photolithography and etching processes may be employed to create the vias 555.

As previously explained, after thinning of the first wafer 301, the vias 330 and, in this instance, the sacrificial material 545 will be visible from the first wafer's backside 311b. These visible vias 330 (and sacrificial material 545) can be used by the processing equipment for registration and alignment, and in one embodiment, after wafer thinning, the exposed vias 330 and/or sacrificial material 545 are used by the processing equipment to perform registration and alignment (see block 290 in FIG. 4A). Thus, alignment of the first wafer 301 (or wafer stack 300) within the processing equipment can take place prior to formation of the vias 555 in dielectric layer 350.

Figure 5F:
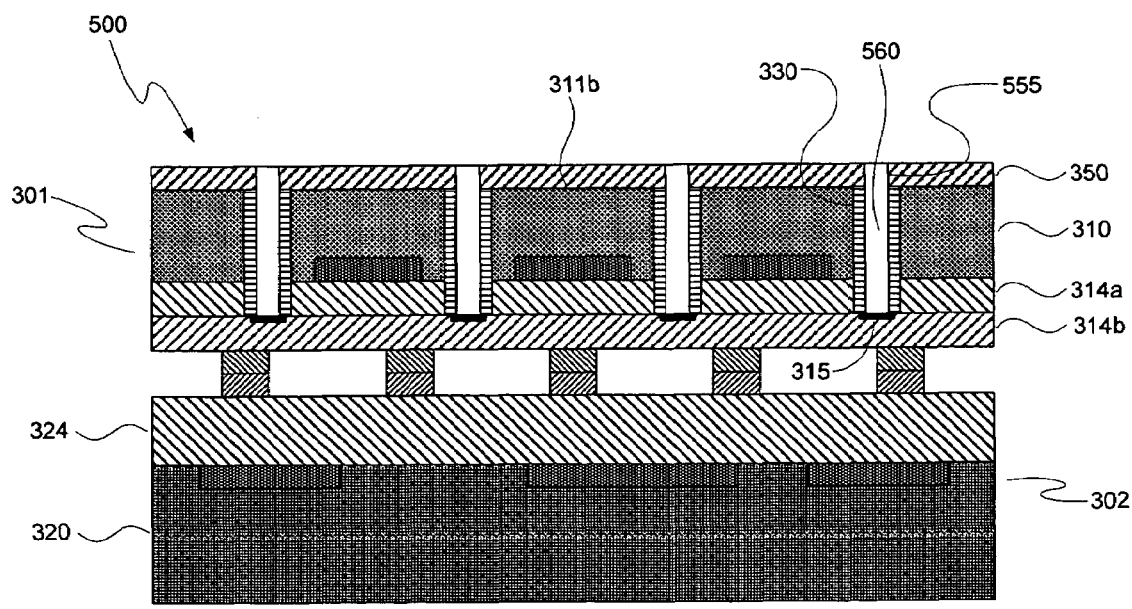

With reference now to block 420, the sacrificial material is removed. This is illustrated in FIG. 5F, where the sacrificial material 545 deposited within vias 330 has been removed. Any suitable process may be employed to remove the sacrificial material. Generally, the removal process should remove the sacrificial material at a much faster rate that the dielectric material 540 (and the ILD material of backside interconnect structure 350). In one embodiment, a chemical etch process is employed to remove the sacrificial material. For example, an HF (Hydrofluoric acid) or a TMAH (Tetramethylammonium Hydroxide) solution will generally remove glasses (e.g., Accuglass™) faster than an oxide (e.g., $SiO_2$) or a nitride (e.g., $Si_3N_4$). In another embodiment, a plasma etching process is used. By way of example, Oxygen or Hydrogen plasmas will generally remove polymers (e.g., SiLK™) faster than oxides (e.g., $SiO_2$) and nitrides (e.g., $Si_3N_4$).

After removal of sacrificial material 545, the result is a number of full-depth vias 560, each via 560 extending through the dielectric layer 350 (i.e., through vias 555) and, further, through the first wafer substrate 310 and first interconnect structure 314a (i.e., within vias 330). The walls of vias 560 within first wafer substrate 310 and first interconnect structure 314a comprise the layer of dielectric material 540 originally deposited in vias 330, whereas the walls of vias 560 within dielectric layer 350 comprise the dielectric material of this layer (i.e., the walls of vias 555). Each via 560 extends down to one of the conductors 315 in the second interconnect 314b.

Figure 5G:
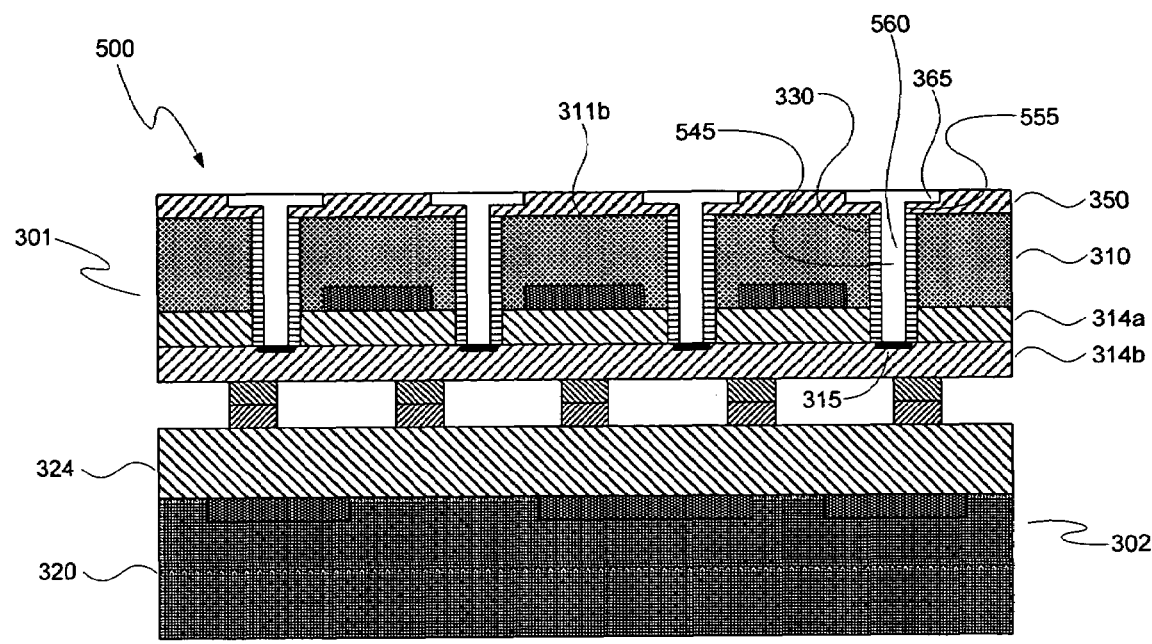

In one embodiment, after removal of the sacrificial material and formation of the full-depth vias, trenches are formed (see block 245), as previously described. This is illustrated in FIG. 5G, where trenches 365 have been formed in the dielectric layer 350, each trench being generally coincident with one of the vias 560 (and one of the vias 555). Again, the trenches, when filled with a conductive material, will form lands upon which conductive leads can be deposited. In an alternative embodiment, the trenches 365 are formed prior to formation of the vias 555.

Figure 5H:
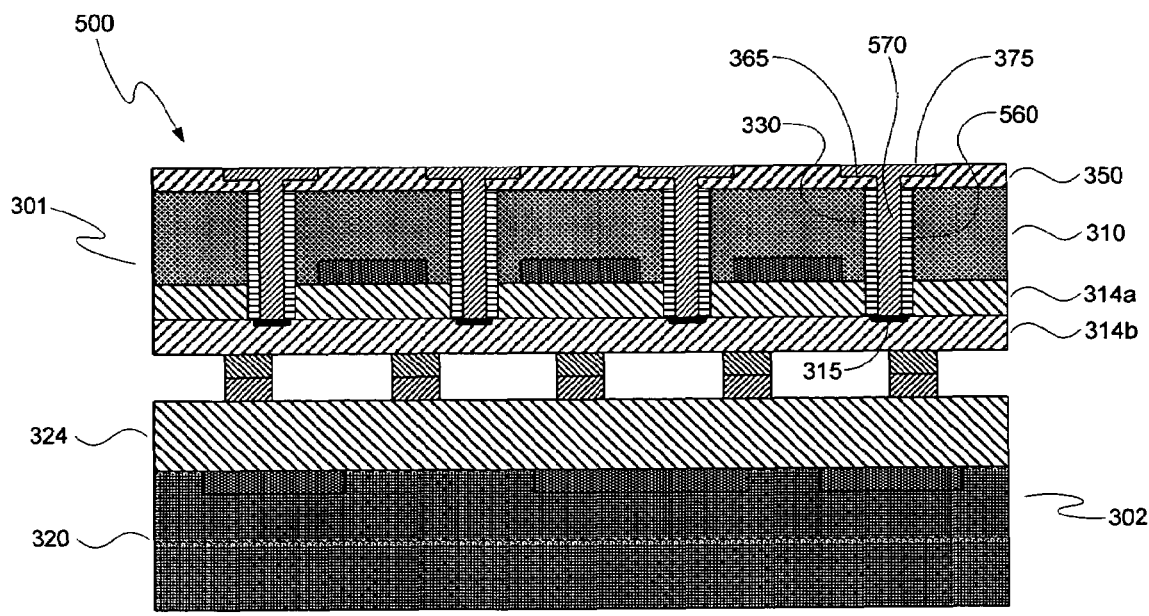

A conductive material is then deposited in each of these full-depth vias, as well as in each of the trenches, which is set forth at block 425. This is shown in FIG. 5H, where a conductive material 570 has been deposited in each of the vias 560. The conductive material 570 has also been deposited in each of the trenches 365 to form a land 375. The conductive material 570 may comprise any conductive material that can be deposited on the dielectric material 540 and the dielectric material 350 and, further, that can be electrically coupled with the conductors 315 in second interconnect structure 314b. In one embodiment, the conductive material 570 comprises Copper. However, it should be understood that any suitable conductive material can be deposited in the vias 560 and, in other embodiments, the conductive material 570 comprises another suitable conductor (e.g., Aluminum, Gold, Silver, etc.). The conductive material 570 may be deposited using any suitable deposition technique. In one embodiment, the conductive material is deposited using a blanket deposition technique, such as CVD, sputtering, or other thin film deposition technique. A planarization process (e.g., CMP) or an etching process is then performed to remove excess conductive material from surfaces of the dielectric layer 350. In another embodiment, the conductive material is deposited in the vias 560 using a selective deposition technique (e.g., electroplating, electroless plating, etc.).

Figure 5I:
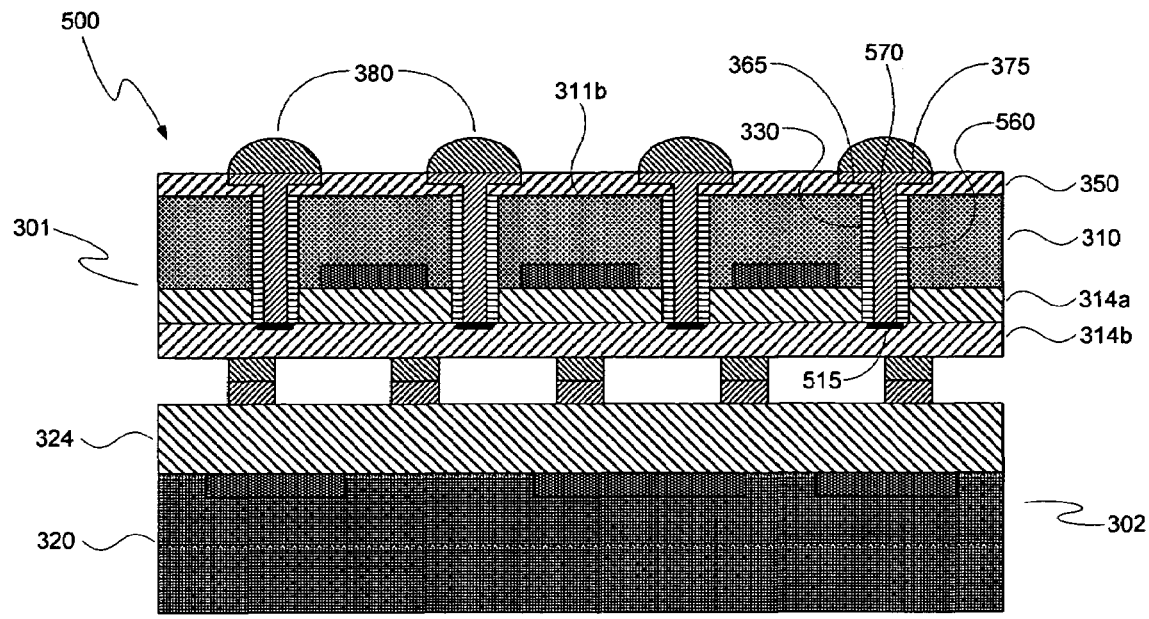

After deposition of conductive material 570 in vias 560 and trenches 365, connections elements 380 are formed on the lands 375 (see block 255), as described above. The formation of connection elements 380 is shown in FIG. 5I. Once again, when the wafer stack 500 is ultimately cut into separate stacked die, the connection elements 380 enable each stacked die to be connected with a next-level component (e.g., a package substrate, a circuit board, a motherboard, another integrated circuit device, a computer system, etc.).

In an alternative embodiment, as described above, the connection elements 380 are formed by continued deposition of the conductive material 370 (i.e., the connection elements 380 comprise the same conductive material as is deposited in the vias 560 and trenches 365). In this embodiment, a mask layer is deposited over the dielectric layer 350, and the conductive material 370 is deposited using a blanket deposition technique, such as CVD, sputtering, or other thin film deposition technique. An etching process is then performed to remove excess conductive material (and the mask layer) from surfaces of the dielectric layer 350. For this embodiment, the conductive material 370 may again be deposited using a selective deposition technique (e.g., electroplating, electroless plating, etc.).

Figure 5J:
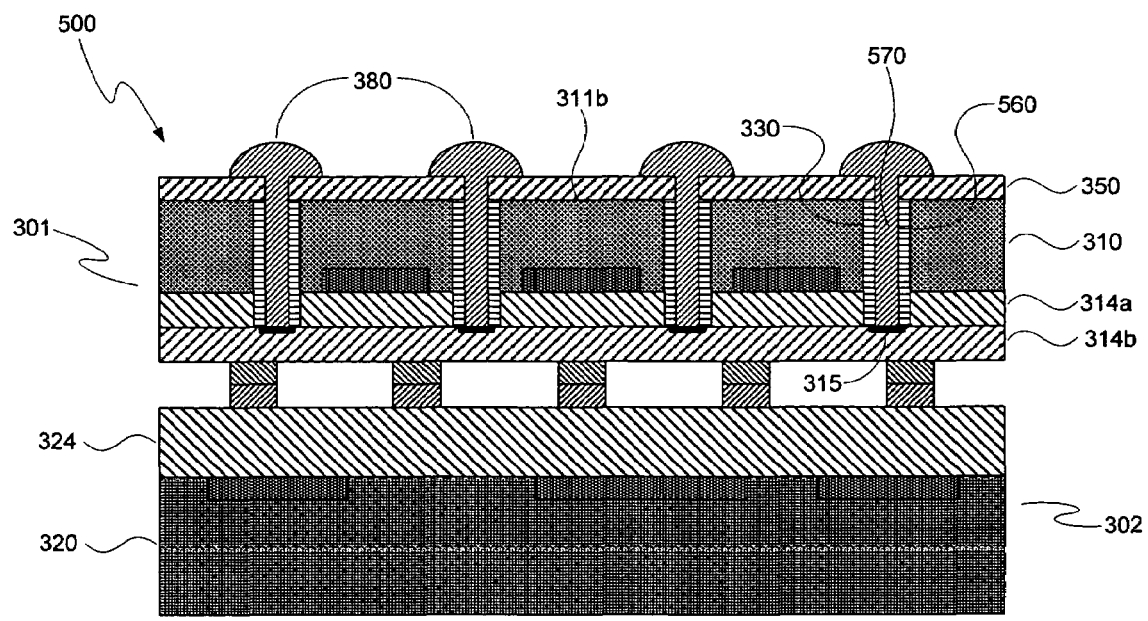

In another embodiment of the method 400, which is set forth at blocks 430 and 435 in FIG. 4A, no trenches are formed. Referring to block 430, after removal of the sacrificial material, a conductive material is then deposited in each of the full-depth vias. This is illustrated in FIG. 5J, where a conductive material 570 has been deposited in each of the vias 560. As noted above, the conductive material 570 may comprise any conductive material that can be deposited on the dielectric material 540 and the dielectric material 350 and, further, that can be electrically coupled with the conductors 315 in second interconnect structure 314b. In one embodiment, the conductive material 570 comprises Copper, but it should be understood that any other suitable conductive material can be deposited in the vias 560 (e.g., Aluminum, Gold, Silver, etc.). Deposition of the conductive material 570 is then continued to form connection elements, which is set forth at block 435. This is also illustrated in FIG. 5J, which shows connection elements 380 formed from the conductive material 570. As previously described, the connection elements 380 may comprise any suitable leads and, in one embodiment, the connection elements 380 comprises an array of conductive balls or columns providing for a flip-chip, C4 connection scheme. The conductive material 570 may be deposited using any suitable deposition technique. In one embodiment, a mask layer (not shown in FIG. 5J) is deposited on the dielectric layer 350, and the conductive material is deposited using a blanket deposition technique, such as CVD, sputtering, or other thin film deposition technique. After film deposition, an etching process is performed to remove excess conductive material (and the mask layer) from the dielectric layer 350. In another embodiment, the conductive material 570 is deposited in the vias 560 using a selective deposition technique (e.g., electroplating, electroless plating, etc.).

Figure 5K:
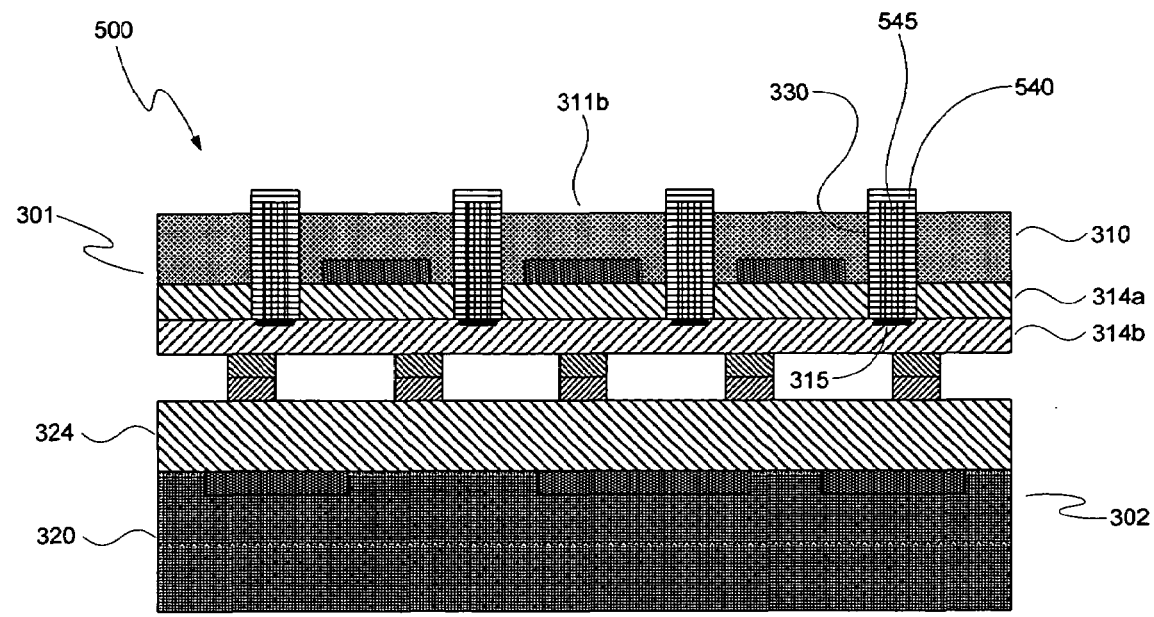

Referring now to FIG. 4B, a further embodiment of the method 400 for forming backside connections on a wafer stack is illustrated. The embodiment of FIG. 4B proceeds in a manner similar to the embodiment of FIG. 4A; however, after wafer bonding (see block 225), the backside of the first wafer is etched to expose the dielectric material that was deposited in the vias, as set forth in block 440. This is illustrated in FIG. 5K, where the backside 311b of the wafer 301 has been etched to expose a portion of the dielectric layer 540 that was deposited in each of the vias 330. In one embodiment, a selective etching process (or selective CMP or selective grinding process) is employed that removes the material of substrate 310 at a faster rate than the dielectric material of layer 540 in vias 330. After etching of the first wafer 301, the backside 311b of first wafer 301 is recessed relative to the dielectric layer 540 within vias 330, and the dielectric layer 540 disposed within each via 330 will be visible from the first wafer's backside 311b. The visible dielectric layer 540 (and vias 330) can be used by the processing equipment for registration and alignment, and in one embodiment, after wafer etching, the exposed dielectric material 540 and/or vias 330 are used by the processing equipment to perform registration and alignment (see block 290 in FIG. 4B).

Figure 5L:
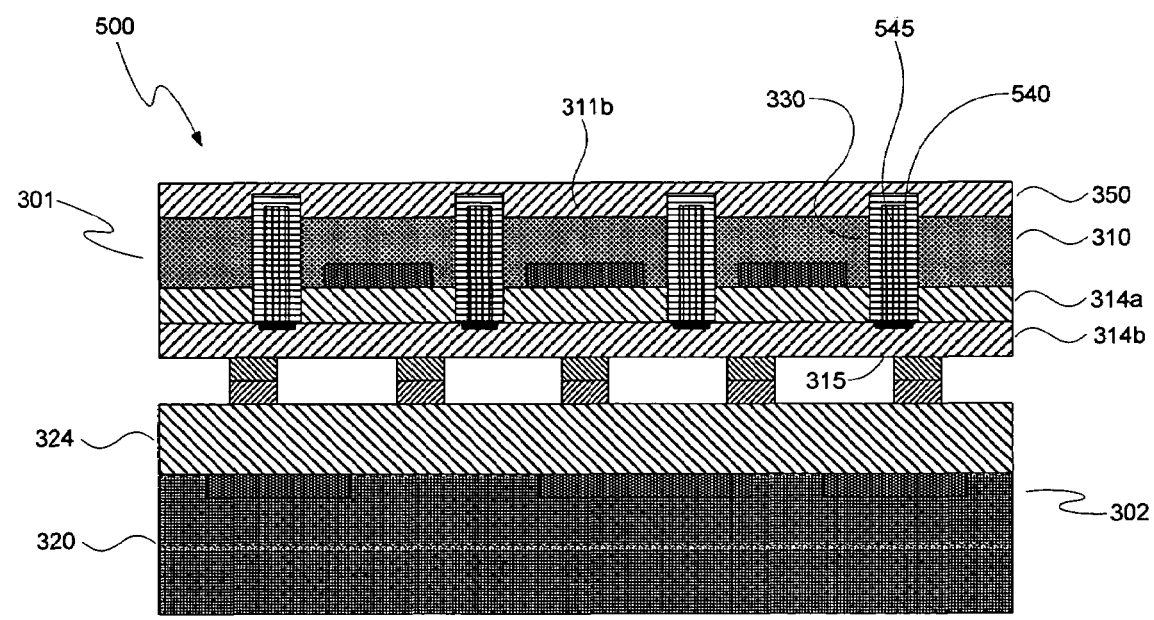
Figure 5M:
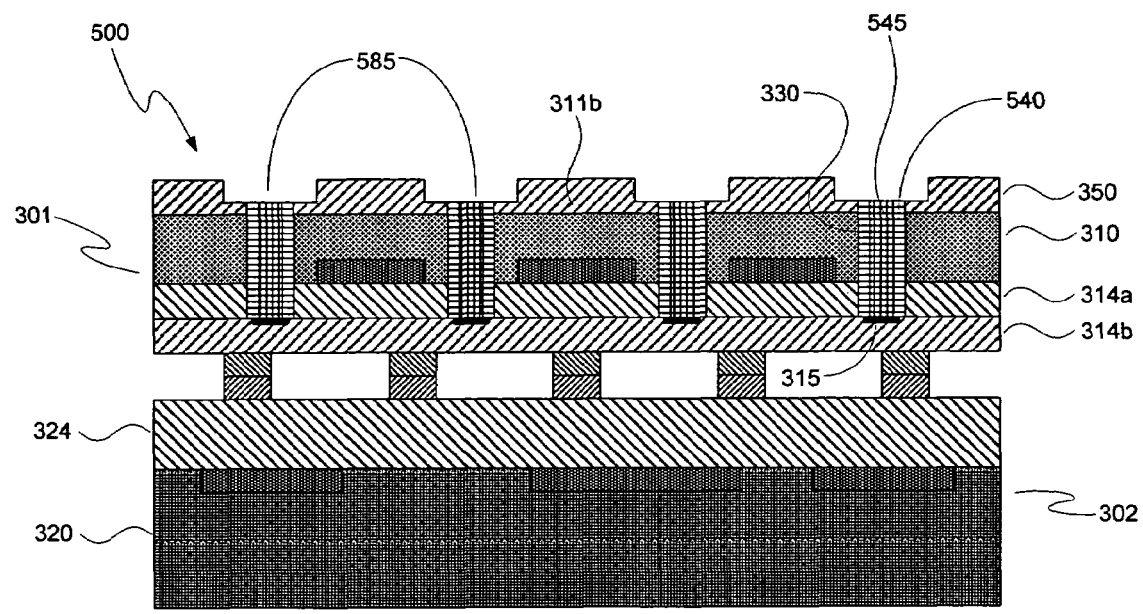

As set forth in block 235, a layer of dielectric material is then deposited over the wafer's backside, as described above. This is shown in FIG. 5L, where a layer of dielectric material 350 has been deposited over the backside 311b of wafer 301, as well as over the surfaces of the dielectric layer 540 in vias 330. Referring to block 445, trenches are formed in the layer of dielectric material, and these trenches will expose the sacrificial material. This is shown in FIG. 5M, where trenches 585 have been formed in the dielectric layer 350. The trenches 585, when filled with conductive material, will form lands for connection elements, as previously described. During formation of the trenches 585, a portion of the layer of dielectric material 540 within each of the vias 330 is also removed, thereby exposing the sacrificial material 545. Any suitable photolithography and etching processes may be employed to form the trenches 585.

Figure 5N:
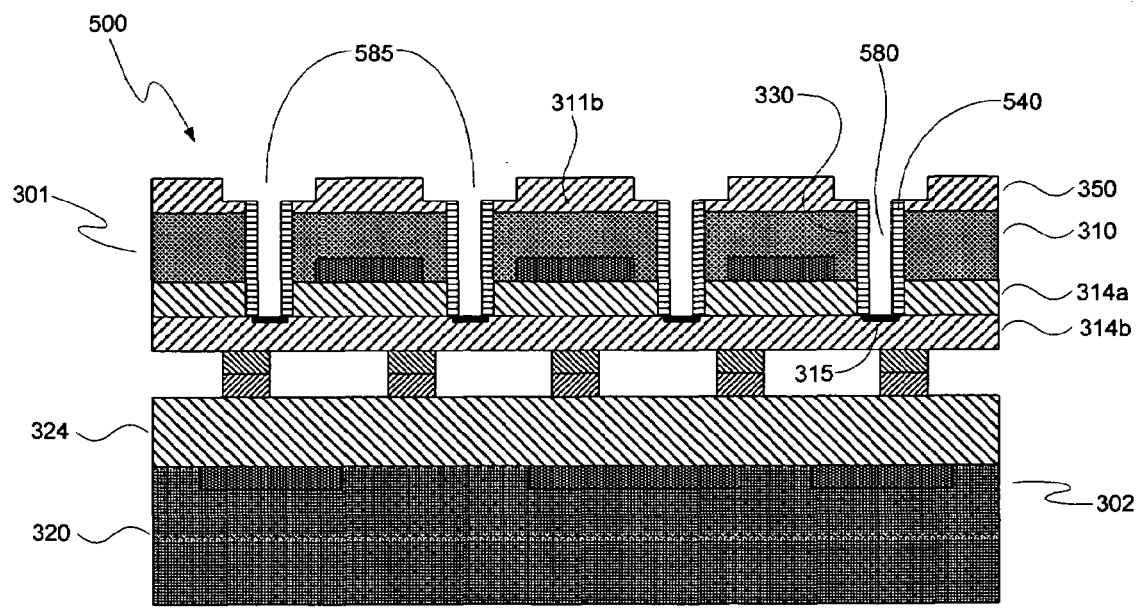
Figure 50:
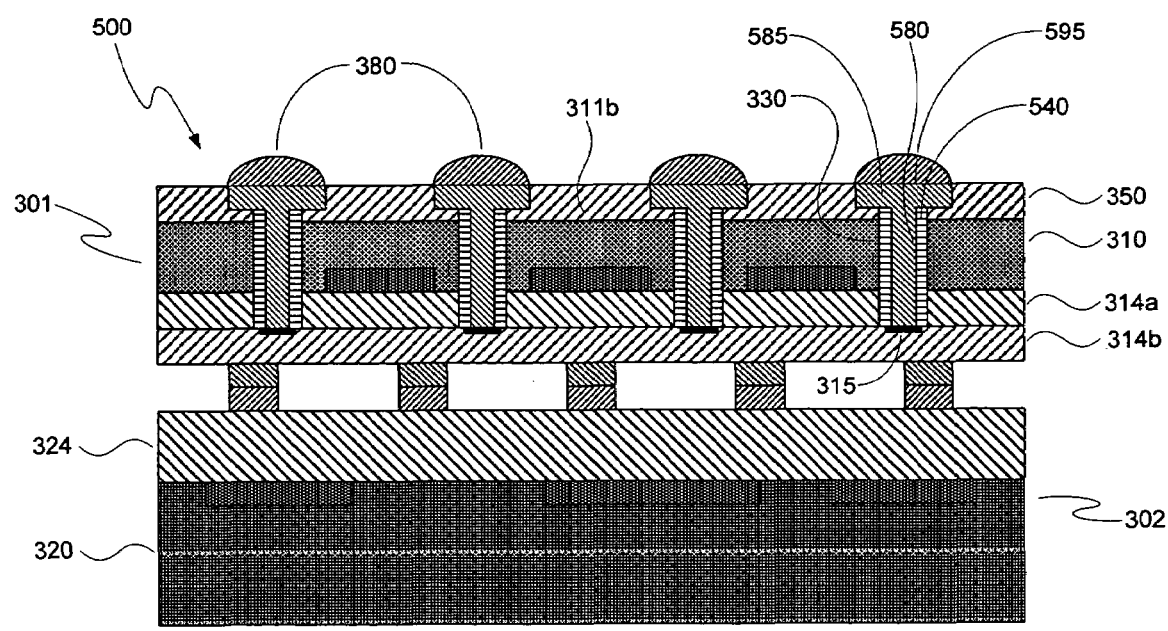

Referring to block 450 in FIG. 4B, the sacrificial material is then removed to create vias, as previously described. This is illustrated in FIG. 5N, where the sacrificial material 545 has been removed to form vias 580. Embodiments for removal of the sacrificial material were described above. As set forth in block 455, conductive material is then deposited in the vias and within the trenches. This is illustrated in FIG. 5O, which shows conductive material 570 deposited within vias 580, and within the trenches 585 to form lands 595. Again, the conductive material 570 may comprise any conductive material (e.g., Copper, Aluminum, Gold, Silver, etc.) that can be deposited on the dielectric material 540 and the dielectric material 350 and, further, that can be electrically coupled with the conductors 315 in second interconnect structure 314b. The conductive material 570 may be deposited using any suitable deposition technique. In one embodiment, the conductive material is deposited using a blanket deposition technique, such as CVD, sputtering, or other thin film deposition technique. A planarization process (e.g., CMP) or an etching process is then performed to remove excess conductive material from surfaces of the dielectric layer 350. In another embodiment, the conductive material is deposited in the vias 580 using a selective deposition technique.

After deposition of conductive material 570 in vias 580 and trenches 585, connections elements 380 are formed on the lands 595 (see block 255), as described above. The formation of connection elements 380 is also shown in FIG. 5O. In an alternative embodiment, as described above, the connection elements 380 may be formed by continued deposition of the conductive material 570 (i.e., the connection elements 380 comprise the same conductive material as is deposited in the vias 580 and trenches 585). In this embodiment, a mask layer is deposited over the dielectric layer 350, and the conductive material 570 is deposited using a blanket deposition technique, such as CVD, sputtering, or other thin film deposition technique. An etching process is then performed to remove excess conductive material (and the mask layer) from surfaces of the dielectric layer 350. For this embodiment, the conductive material 570 may again be deposited using a selective deposition technique (e.g., electroplating, electroless plating, etc.).

Figure 6A:
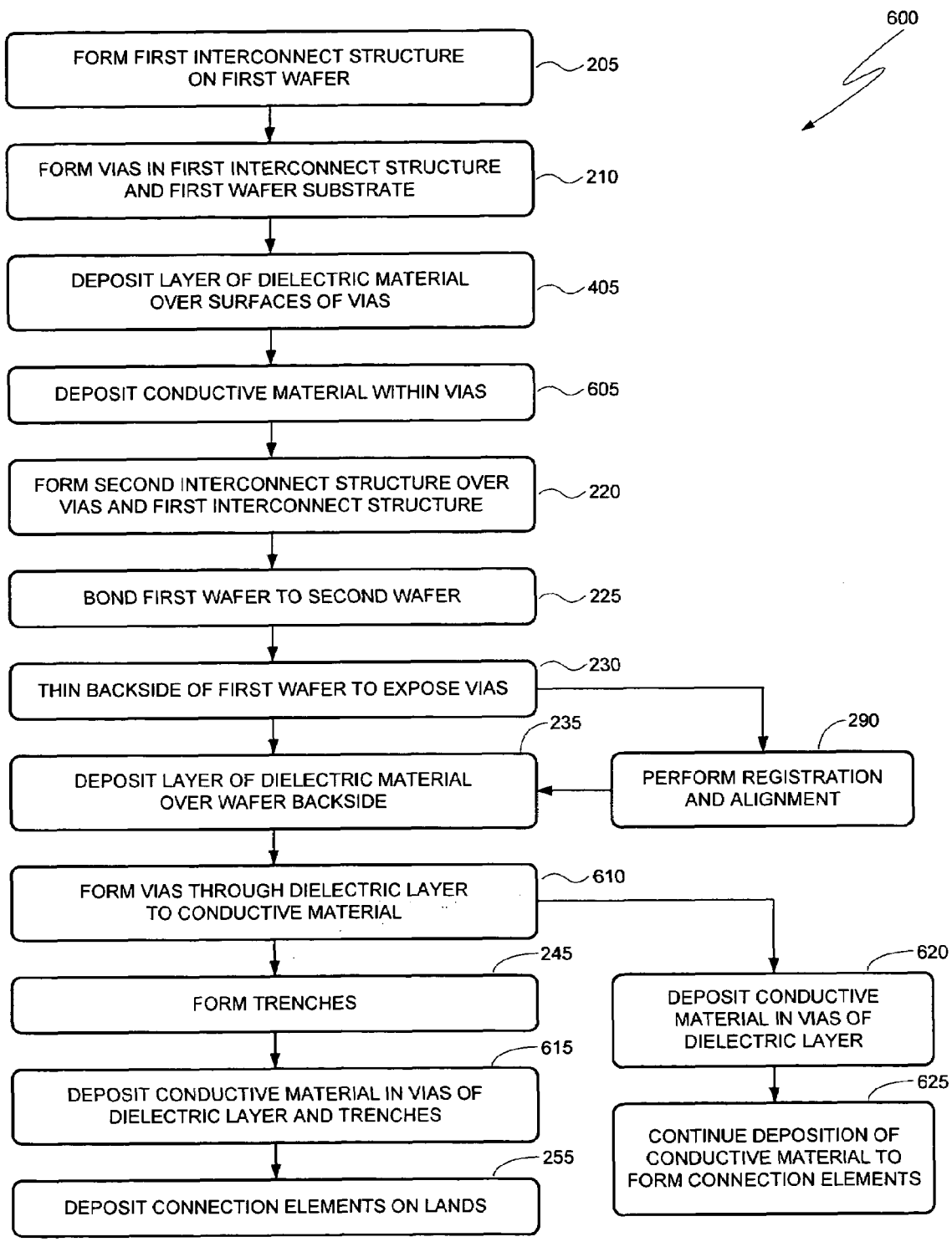
FIGS. 6A–6B are block diagrams illustrating a further embodiment of a method of forming backside electrical connections on a wafer stack.
Figure 6B:
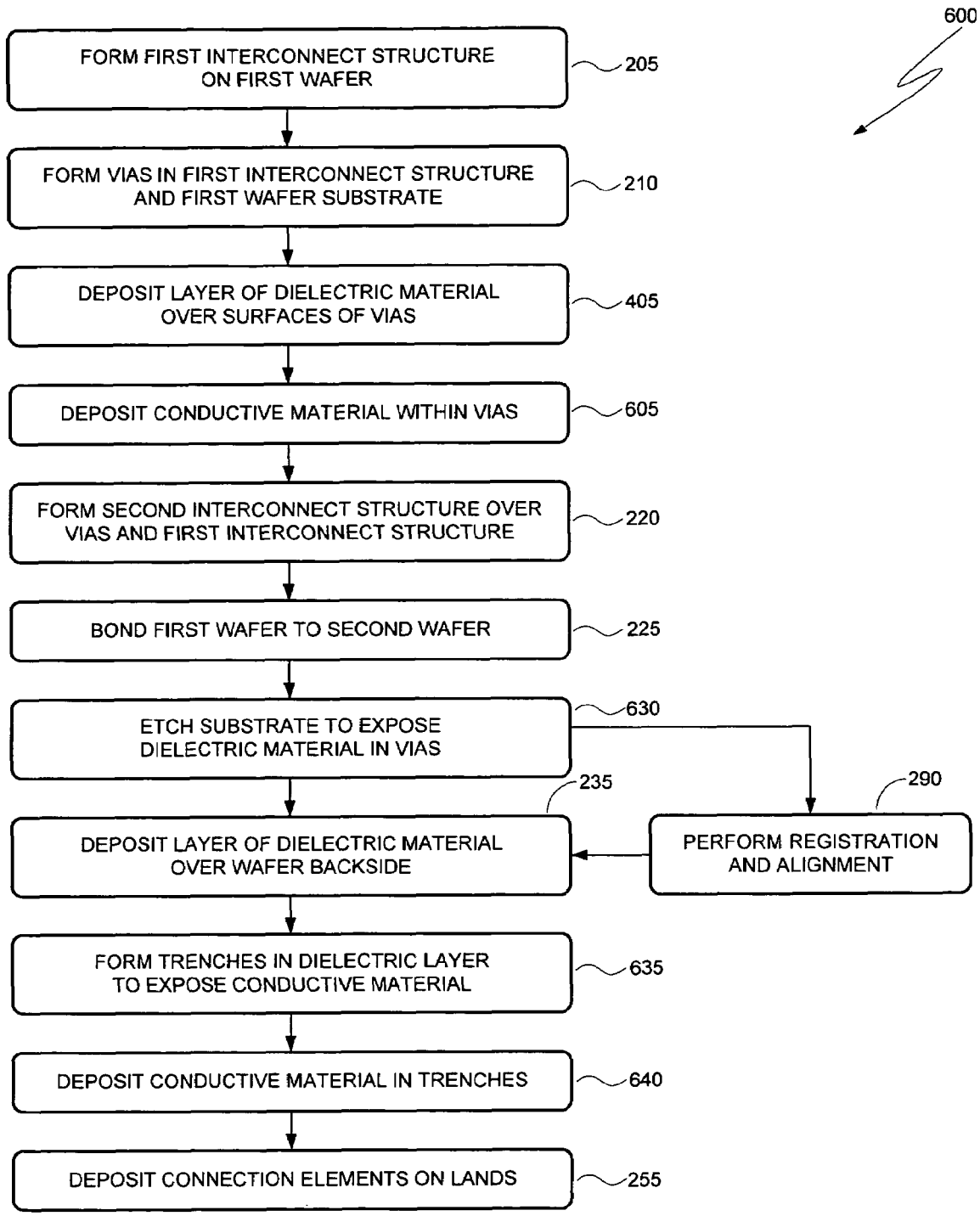

Referring now to FIGS. 6A and 6B, illustrated is a further embodiment of a method 600 of forming backside connections on a wafer stack. The embodiments of the method 600 shown in FIGS. 6A and 6B are further illustrated in the schematic diagrams of FIGS. 7A through 7K, and reference should be made to these figures as called out in the text. It should be noted that many of the blocks shown in the block diagrams of FIGS. 6A and 6B recite features that are the same as features recited in a corresponding block of one of FIGS. 2, 4A, and/or 4B, and like reference numerals are used in each of FIGS. 6A and 6B to identify like features. Similarly, many of the elements shown in the schematic diagrams of FIGS. 7A–7K are the same as those shown in FIGS. 3A–3M and/or FIGS. 5A–5O, and like reference numerals are used in each of FIGS. 7A–7K to reference like elements. Also, in some instances, a description of features or elements previously described may not be repeated in the following text.

Figure 7A:
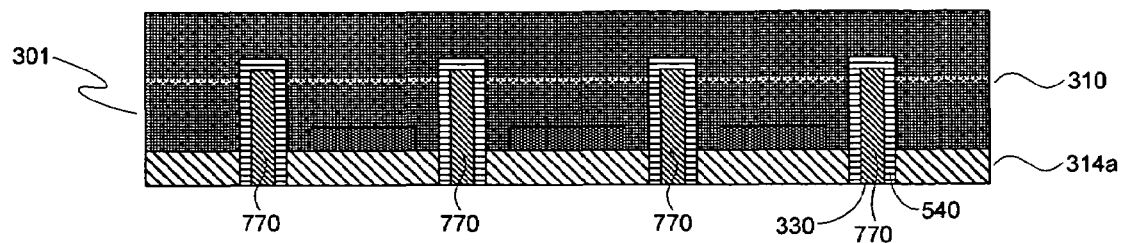
FIGS. 7A–7K are schematic diagrams illustrating embodiments of the method of forming backside electrical connections on a wafer stack, as shown in FIGS. 6A–6B.

Beginning with FIG. 6A, referring to block 605, after formation of the first interconnect structure 314a on first wafer 310 (see block 205), after formation of the vias 330 extending through the first interconnect 314a and into the first wafer substrate 310 (see block 210), and after deposition of a dielectric layer 540 within the vias 330 (see block 405), all as described above, a conductive material is deposited within the vias. This is illustrated in FIG. 7A, where a conductive material 770 has been deposited over the dielectric layer 540 within each via 330. The conductive material 770 may comprise any conductive material that can be deposited on the dielectric material 540 and, further, that can be electrically coupled with the conductors 315 in second interconnect structure 314b. In one embodiment, the conductive material 770 comprises Copper. However, it should be understood that any suitable conductive material can be deposited in the vias 330 and, in other embodiments, the conductive material 770 comprises another suitable conductor (e.g., Aluminum, Gold, Silver, etc.). The conductive material 770 may be deposited using any suitable deposition technique. In one embodiment, the conductive material is deposited using a blanket deposition technique, such as CVD, sputtering, or other thin film deposition technique. A planarization process (e.g., CMP) or an etching process is then performed to remove excess conductive material from surfaces of the uppermost ILD layer of the first interconnect 314a. In another embodiment, the conductive material is deposited in the vias 330 using a selective deposition technique (e.g., electroplating, electroless plating, etc.).

Figure 7B:
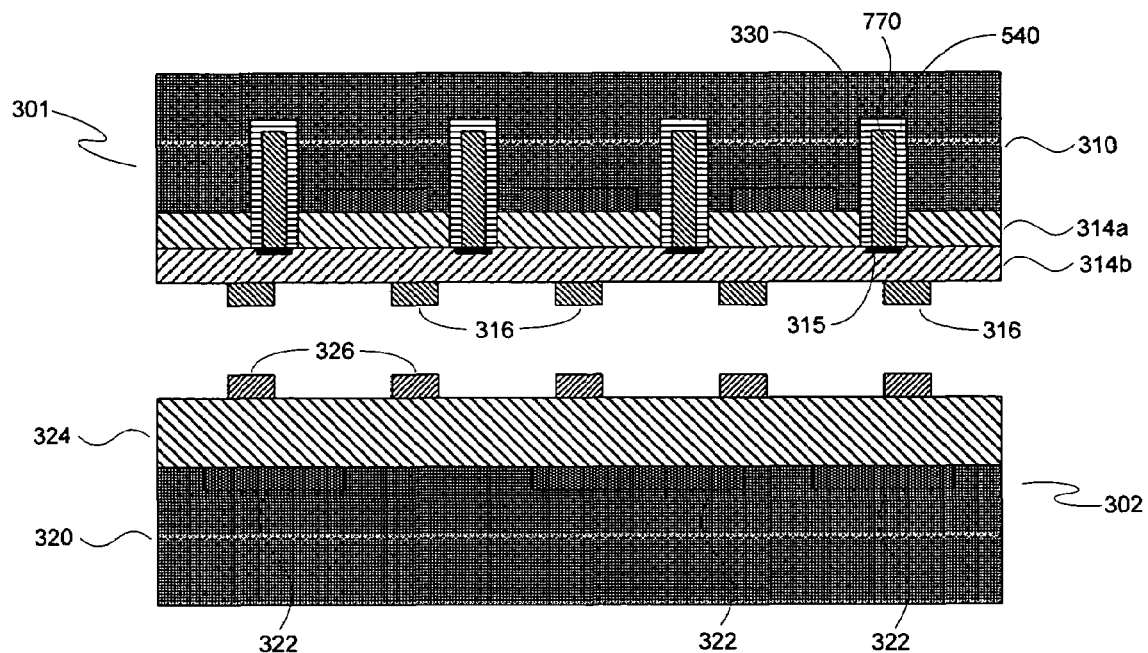
Figure 7C:
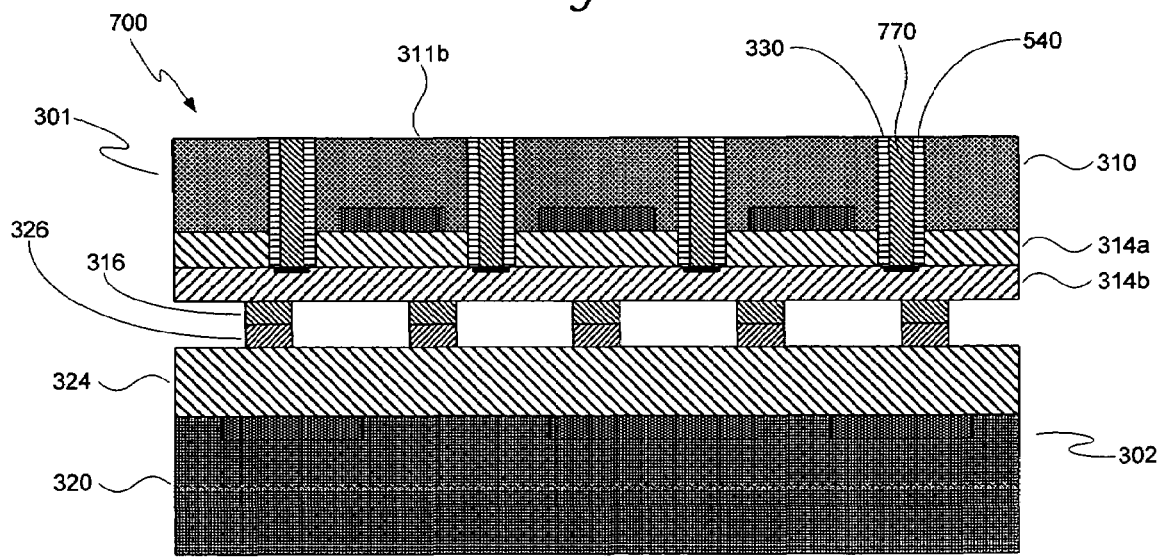

After deposition of the conductive material, the second interconnect structure 314b is formed (see block 220), as described above. This is illustrated in FIG. 7B. Note that each conductor 315 of second interconnect 314b is electrically coupled with the conductive material 770 in one of the vias 330. The first and second wafers 301, 302 are then bonded (see block 225) to form a wafer stack 700, as previously described, and this is illustrated in FIG. 7C. Also as described above, thinning of the backside 311b of the first wafer is performed (see block 230) to expose the vias 330, as well as conductive material 770 and dielectric layer 540, which is also illustrated in FIG. 7C.

Figure 7D:
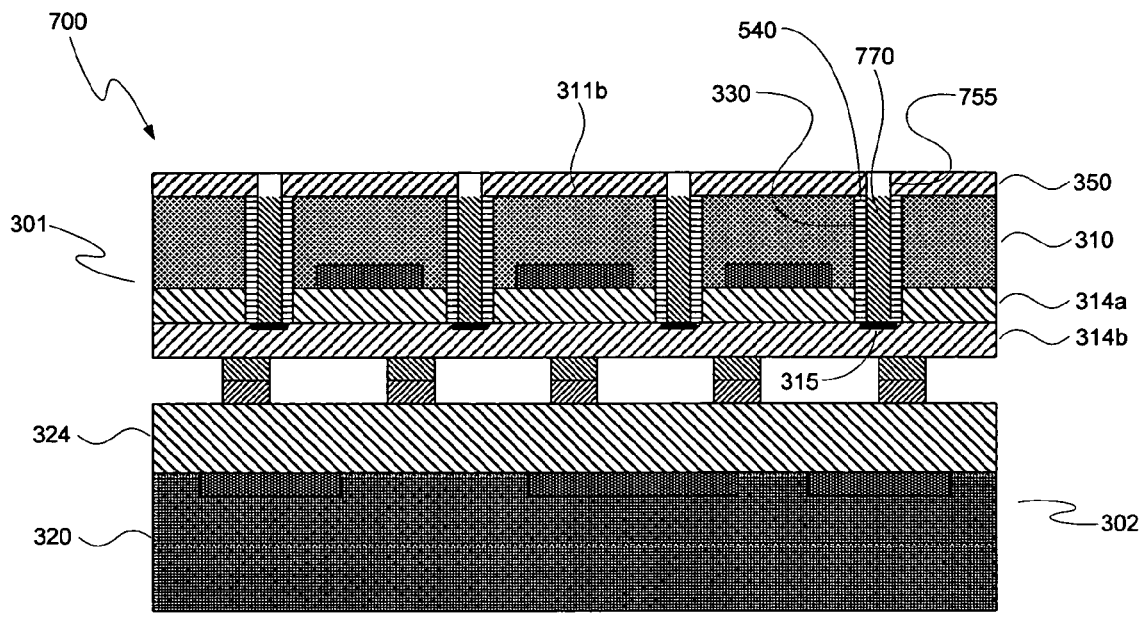

After wafer thinning, a layer of dielectric material 350 is deposited on the first wafer's backside 311b (see block 235), as previously described, which is illustrated in FIG. 7D. Referring to block 610, vias are then formed through the dielectric layer that extend to the conductive material. This is also illustrated in FIG. 7D, where a number of vias 755 has been formed, each via 755 extending through the dielectric layer 350 and to the conductive material 770 that was deposited in the original vias 330. Each via 755 is generally coincident with one of the vias 330, and the vias 755 in dielectric layer 350 are to be used (in conjunction with the conductive material 770 in vias 330) for backside connections, as will be explained below. Any suitable photolithography and etching processes may be employed to create the vias 755.

As described above, after thinning of the first wafer 301, the vias 330 and, in this instance, the conductive material 770 will be visible from the first wafer's backside 311b. These visible vias 330 (and conductive material 770) can be used by the processing equipment for registration and alignment, and in one embodiment, after wafer thinning, the exposed vias 330 and/or conductive material 770 are used by the processing equipment to perform registration and alignment (see block 290 in FIG. 6). Thus, alignment of the first wafer 301 (or wafer stack 300) within the processing equipment can take place prior to formation of the vias 755 in dielectric layer 350.

Figure 7E:
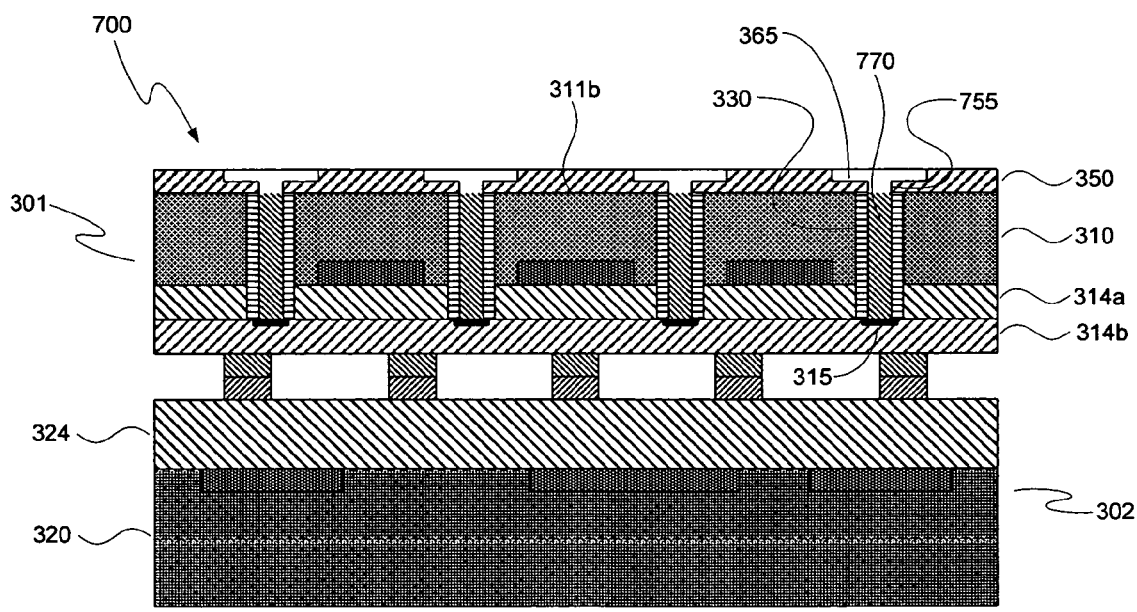

In one embodiment, after formation of the vias in the dielectric layer, trenches are formed (see block 245), as previously described. This is illustrated in FIG. 7E, where trenches 365 have been formed in the dielectric layer 350, each trench being generally coincident with one of the vias 330 (and one of the vias 755). In an alternative embodiment, the trenches 365 are formed prior to formation of the vias 755.

Figure 7F:
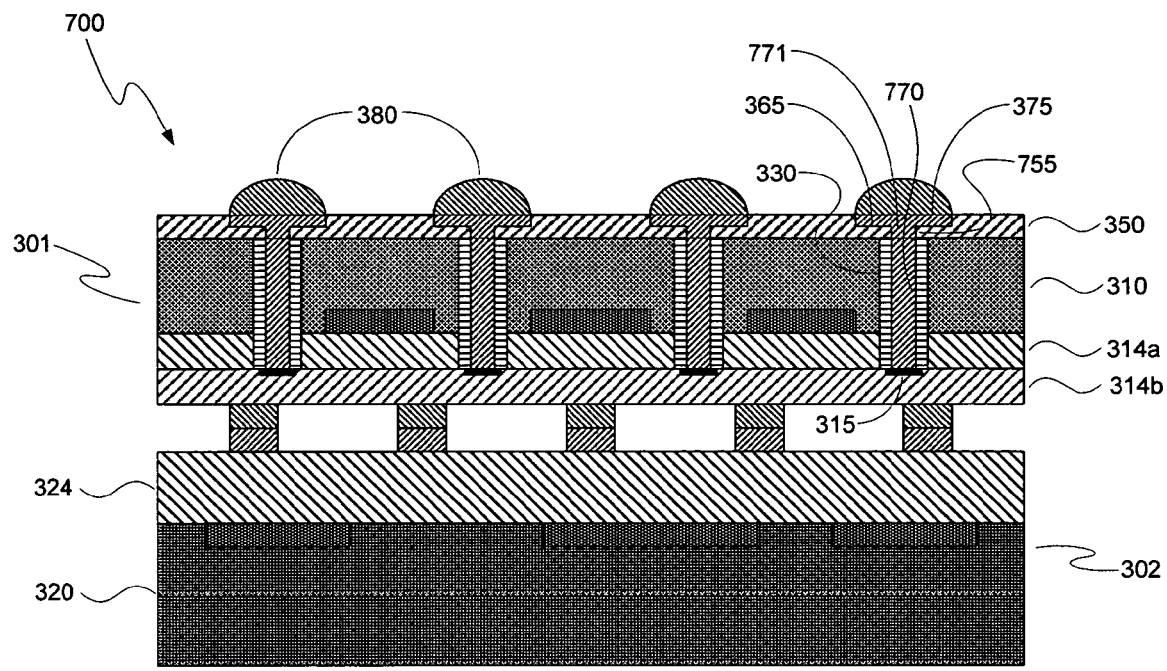

After formation of the vias extending through the dielectric layer and the trenches, a conductive material is deposited in each of the vias and trenches, as set forth at block 615. This is shown in FIG. 7F, where a conductive material 771 has been deposited in each of the vias 755 and, further, in each of the trenches 365 to form lands 375. The conductive material 771 may comprise any conductive material that can be deposited over the material of dielectric layer 350 and, further, that can be electrically coupled with the conductive material 770 in underlying vias 330. Generally, the conductive material 771 deposited in vias 755 will comprise the same conductive material as that deposited in the underlying vias 330; however, in another embodiment, the conductive materials 770, 771 are not the same. In one embodiment, the conductive material 771 (and perhaps conductive material 770) comprises Copper. However, it should be understood that any suitable conductive material can be deposited in the vias 755 and, in other embodiments, the conductive material 771 comprises another suitable conductor (e.g., Aluminum, Gold, Silver, etc.). The conductive material 771 may be deposited using any suitable deposition technique. In one embodiment, the conductive material is deposited using a blanket deposition technique, such as CVD, sputtering, or other thin film deposition technique. A planarization process (e.g., CMP) or an etching process is then performed to remove excess conductive material from surfaces of the dielectric layer 350. In another embodiment, the conductive material is deposited in the vias 755 (and trenches 365) using a selective deposition technique (e.g., electroplating, electroless plating, etc.).

Connections elements 380 then are formed on the lands 375 (see block 255), as described above. The formation of connection elements 380 is also shown in FIG. 7F. When the wafer stack 700 is ultimately cut into separate stacked die, the connection elements 380 enable each stacked die to be connected with a next-level component (e.g., a package substrate, a circuit board, a motherboard, another integrated circuit device, a computer system, etc.), as previously described.

In an alternative embodiment, the connection elements 380 are formed by continued deposition of the conductive material 771 (i.e., the connection elements 380 comprise the same conductive material as is deposited in the vias 755 and trenches 375). In this embodiment, a mask layer is deposited over the dielectric layer 350, and the conductive material 771 is deposited using a blanket deposition technique, such as CVD, sputtering, or other thin film deposition technique. An etching process is then performed to remove excess conductive material (and the mask layer) from surfaces of the dielectric layer 350. For this embodiment, the conductive material 771 may again be deposited using a selective deposition technique (e.g., electroplating, electroless plating, etc.).

Figure 7G:
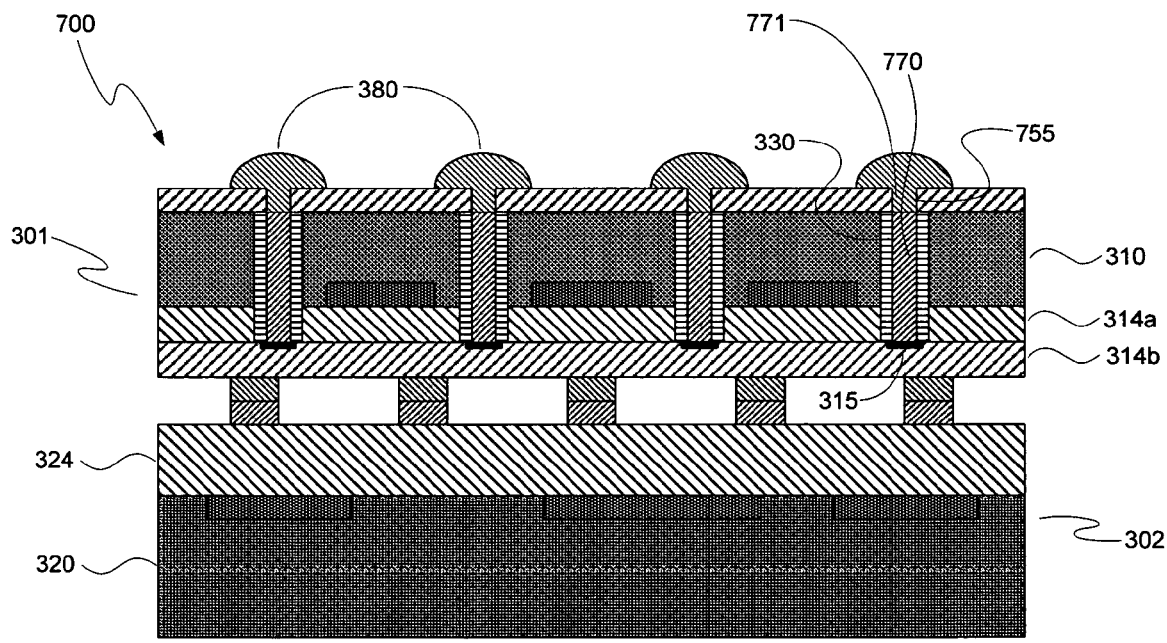

In another embodiment of the method 600, which is set forth at blocks 620 and 625 in FIG. 6A, no trenches are formed. Referring to block 620, after formation of vias in the dielectric layer, a conductive material is deposited in each via of the dielectric layer. This is illustrated in FIG. 7G, where a conductive material 771 has been deposited in each of the vias 755. As previously described, the conductive material 771 may comprise any conductive material that can be deposited over the material of dielectric layer 350 and, further, that can be electrically coupled with the conductive material 770 in underlying vias 330. Generally, the conductive material 771 deposited in vias 755 will comprise the same conductive material as that deposited in the underlying vias 330; however, in another embodiment, the conductive materials 770, 771 are not the same. In one embodiment, the conductive material 771 (and conductive material 770) comprises Copper, but in other embodiments, the conductive material 771 comprises another suitable conductor (e.g., Aluminum, Gold, Silver, etc.). Deposition of the conductive material 771 is then continued to form connection elements, which is set forth at block 625. This is also illustrated in FIG. 7G, which shows connection elements 380 formed from the conductive material 771. As previously described, the connection elements 380 may comprise any suitable leads and, in one embodiment, the connection elements 380 comprises an array of conductive balls or columns providing for a flip-chip, C4 connection scheme. The conductive material 771 may be deposited using any suitable deposition technique. In one embodiment, a mask layer (not shown in FIG. 7G) is deposited on the dielectric layer 350, and the conductive material is deposited using a blanket deposition technique, such as CVD, sputtering, or other thin film deposition technique. After film deposition, an etching process is performed to remove excess conductive material (and the mask layer) from the dielectric layer 350. In another embodiment, the conductive material 771 is deposited in the vias 755 using a selective deposition technique (e.g., electroplating, electroless plating, etc.).

Figure 7H:
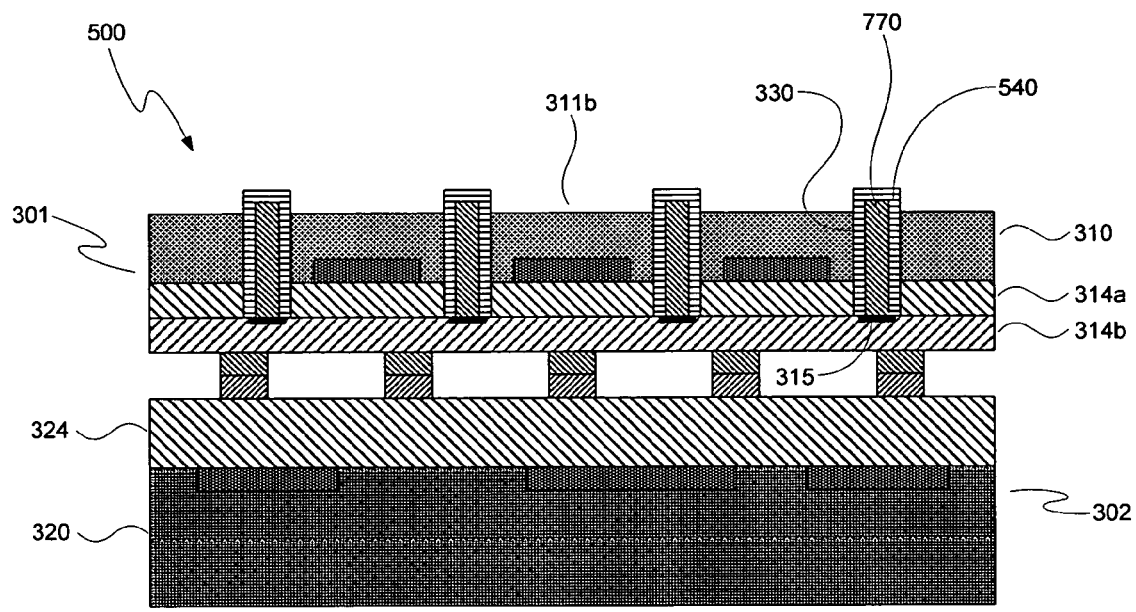

Referring now to FIG. 6B, a further embodiment of the method 600 for forming backside connections on a wafer stack is illustrated. The embodiment of FIG. 6B proceeds in a manner similar to the embodiment of FIG. 6A; however, after wafer bonding (see block 225), the backside of the first wafer is etched to expose the dielectric material that was deposited in the vias, which is set forth at block 630 in FIG. 6B. This is illustrated in FIG. 7H, where the backside 311b of the wafer 301 has been etched to expose a portion of the dielectric layer 540 that was deposited in each of the vias 330. In one embodiment, a selective etching process (or selective CMP or selective grinding process) is employed that removes the material of substrate 310 at a faster rate than the dielectric material of layer 540 in vias 330. After etching of the first wafer 301, the backside 311b of first wafer 301 is recessed relative to the dielectric layer 540 within vias 330, and the dielectric layer 540 disposed within each via 330 will be visible from the first wafer's backside 311b. The visible dielectric layer 540 (and vias 330) can be used by the processing equipment for registration and alignment, and in one embodiment, after wafer etching, the exposed dielectric material 540 and/or vias 330 are used by the processing equipment to perform registration and alignment (see block 290 in FIG. 6B).

Figure 7I:
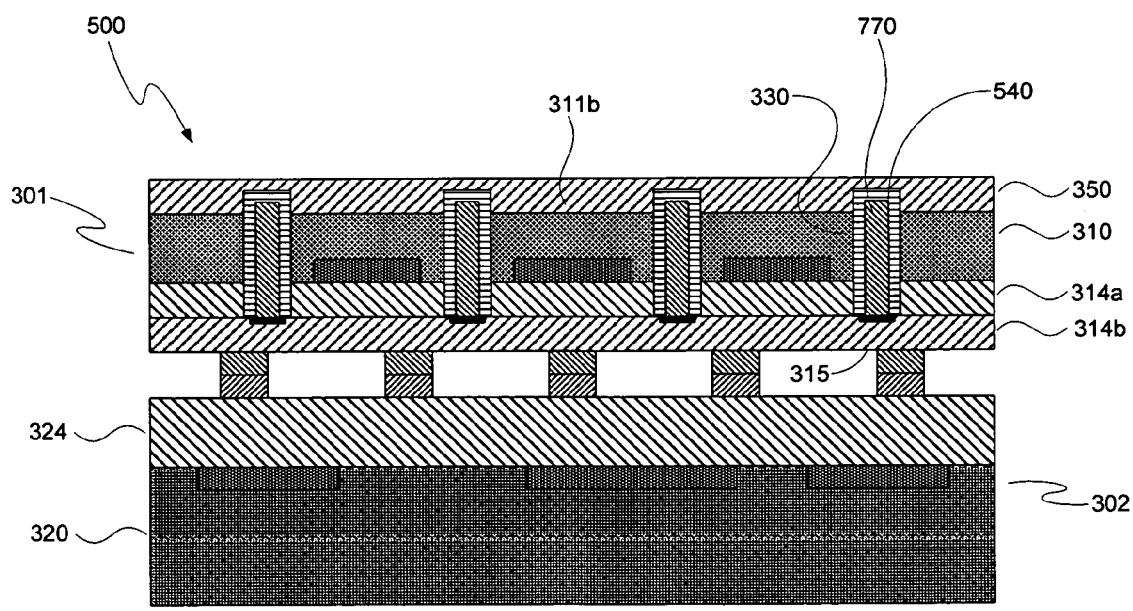
Figure 7J:
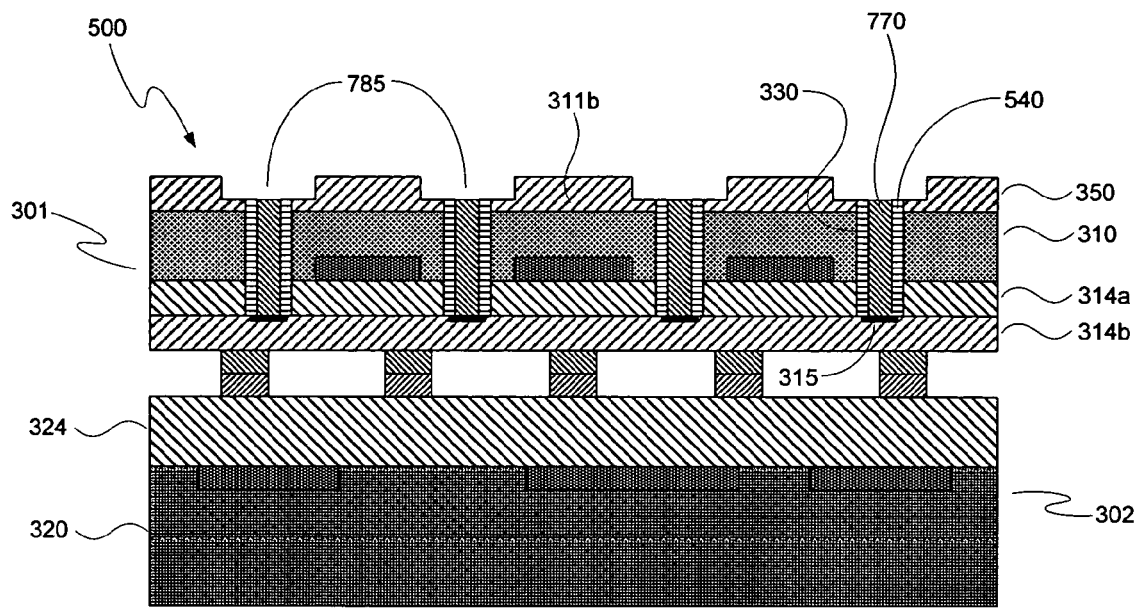

As set forth in block 235, a layer of dielectric material is then deposited over the wafer's backside, as described above. This is shown in FIG. 7I, where a layer of dielectric material 350 has been deposited over the backside 311b of wafer 301, as well as over the surfaces of the dielectric layer 540 in vias 330. Referring to block 635, trenches are formed in the layer of dielectric material, and these trenches will expose the conductive material in the vias. This is shown in FIG. 7J, where trenches 785 have been formed in the dielectric layer 350. The trenches 585, when filled with conductive material, will form lands for connection elements, as previously described. During formation of the trenches 785, a portion of the layer of dielectric material 540 within each of the vias 330 is also removed, thereby exposing the conductive material 770. Any suitable photolithography and etching processes may be employed to form the trenches 785.

Figure 7K:
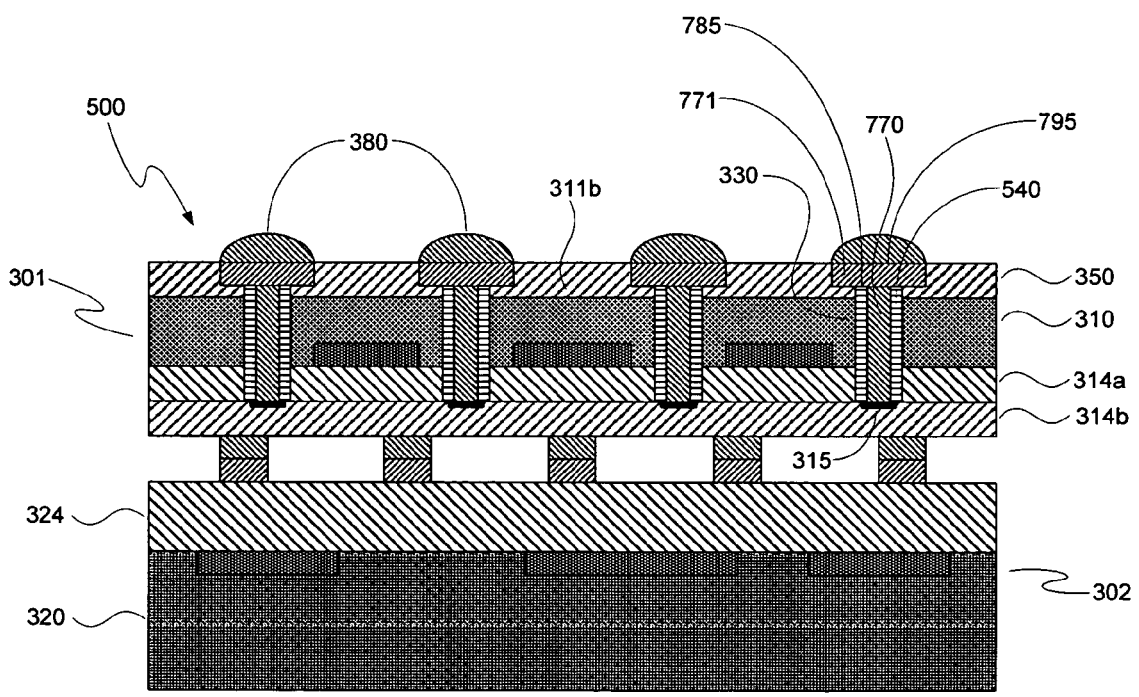

Referring to block 640, conductive material is then deposited in the trenches. This is illustrated in FIG. 7K, which shows conductive material 771 deposited within the trenches 785 to form lands 795. Again, the conductive material 771 may comprise any conductive material that can be deposited over the material of dielectric layer 350 and, further, that can be electrically coupled with the conductive material 770 in underlying vias 330. Generally, the conductive material 771 deposited in trenches 785 will comprise the same conductive material (e.g., Copper, Aluminum, Gold, Silver, etc.) as that deposited in the underlying vias 330; however, in another embodiment, the conductive materials 770, 771 are not the same. The conductive material 771 may be deposited using any suitable deposition technique. In one embodiment, the conductive material is deposited using a blanket deposition technique, such as CVD, sputtering, or other thin film deposition technique. A planarization process (e.g., CMP) or an etching process is then performed to remove excess conductive material from surfaces of the dielectric layer 350. In another embodiment, the conductive material is deposited in the trenches 785 using a selective deposition technique.

After deposition of conductive material 771 in trenches 785, connection elements 380 are formed on the lands 795 (see block 255), as described above. The formation of connection elements 380 is also shown in FIG. 7K. In an alternative embodiment, as described above, the connection elements 380 may be formed by continued deposition of the conductive material 771 (i.e., the connection elements 380 comprise the same conductive material as is deposited in the trenches 785). In this embodiment, a mask layer is deposited over the dielectric layer 350, and the conductive material 771 is deposited using a blanket deposition technique, such as CVD, sputtering, or other thin film deposition technique. An etching process is then performed to remove excess conductive material (and the mask layer) from surfaces of the dielectric layer 350. For this embodiment, the conductive material 771 may again be deposited using a selective deposition technique (e.g., electroplating, electroless plating, etc.).

Various embodiments of methods 200, 400, 600 for forming backside connections on a wafer stack having been herein described, those of ordinary skill in the art will appreciate the advantages of the disclosed embodiments. Backside connections are formed without the need to achieve registration between features being formed on a wafer's backside and features constructed at the wafer's front side. Where vias are formed at the wafer's backside, other features (e.g., vias, oxide plugs, etc.) formed at the opposing side are visible after wafer thinning and can be used for registration and alignment. Thus, alignment is readily maintained for those structures used to create backside connections, thereby providing a simplified process flow, lower costs, and higher yields. In addition, the electrical connections between the backside interconnects and the interconnect structure formed on the bonded wafer can take place at any desired ILD layer within the wafer's interconnect structure.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
    forming a first interconnect structure on one side of a first wafer;
    forming a number of vias, each of the vias extending through the first interconnect structure and into the first wafer;
    depositing a layer of insulating material over a surface of each of the number of vias;
    depositing a sacrificial material on the insulating layer in each of the number of vias;
    forming a second interconnect structure over the first interconnect structure, wherein the sacrificial material in each of the number of vias extends to one of a number of conductors in the second interconnect structure; and
    bonding the first wafer to a second wafer to form a wafer stack.

2. The method of claim 1, further comprising:
    thinning an opposing side of the first wafer to expose the sacrificial material within each of the vias.

3. The method of claim 2, further comprising performing alignment of the wafer stack using the exposed vias and sacrificial material.

4. The method of claim 2, further comprising depositing a layer of dielectric material over the opposing side of the first wafer and the exposed vias.

5. The method of claim 4, further comprising:
    forming a number of other vias, each of the other vias extending through the dielectric layer and to the sacrificial material in one of the number of vias; and
    removing the sacrificial material from each of the number of vias, wherein each of the vias extends to one of a number of conductors in the second interconnect structure.

6. The method of claim 5, further comprising:
    forming a number of trenches in the dielectric layer, each trench located coincident with one of the other vias; and
    depositing a conductive material in each of the vias and each of the trenches, the conductive material in each of the trenches forming a land.

7. The method of claim 6, wherein the conductive material comprises a copper material.

8. The method of claim 6, further comprising depositing a connection element on each of the lands.

9. The method of claim 6, further comprising continuing deposition of the conductive material to form connection elements proximate at least some of the trenches.

10. The method of claim 5, further comprising depositing a conductive material in each of the vias.

11. The method of claim 10, wherein the conductive material comprises a copper material.

12. The method of claim 10, further comprising continuing deposition of the conductive material to form connection elements proximate at least some of the vias.

13. The method of claim 5, wherein the sacrificial material comprises one of a glass material and a polymer material.

14. The method of claim 5, wherein removing the sacrificial material comprises performing an etching process.

15. The method of claim 14, wherein the etching process is performed using a solution that removes the sacrificial material at a faster rate than the dielectric material.

16. The method of claim 1, further comprising:
    etching an opposing side of the first wafer to expose the layer of insulating material in each of the vias.

17. The method of claim 16, further comprising performing alignment of the wafer stack using the exposed vias and insulating material.

18. The method of claim 16, further comprising depositing a layer of dielectric material over the opposing side of the first wafer and the exposed insulating material.

19. The method of claim 18, further comprising:
    forming a number of trenches in the dielectric layer and the exposed insulating material to expose the sacrificial material; and
    removing the sacrificial material from each of the number of vias, wherein each of the vias extends to one of a number of conductors in the second interconnect structure.

20. The method of claim 19, further comprising depositing a conductive material in each of the vias and each of the trenches.

21. The method of claim 20, wherein the conductive material in each of the trenches forms a land, the method further comprising depositing a connection element on each of the lands.

22. The method of claim 20, further comprising continuing deposition of the conductive material to form connection elements proximate at least some of the trenches.

23. The method of claim 1, wherein the insulating material comprises one of an oxide material, a nitride material, and a carbide material.

24. The method of claim 23, wherein the insulating material comprises one of $SiO_2$, $Si_3N_4$, and SiC.

25. The method of claim 1, further comprising cutting the wafer stack into a plurality of stacked die.

26. The method of claim 25, further comprising packaging one of the stacked die to form a packaged integrated circuit device.

27. The method of claim 1, further comprising forming at least one dummy via extending through the first interconnect structure and into the first wafer.

28. A method comprising:
    forming a first interconnect structure on one side of a first wafer;
    forming a number of vias, each of the vias extending through the first interconnect structure and into the first wafer;
    depositing a layer of insulating material over a surface of each of the number of vias;
    depositing a conductive material on the insulating layer in each of the number of vias;
    forming a second interconnect structure over the first interconnect structure, wherein the conductive material in each of the number of vias extends to one of a number of conductors in the second interconnect structure; and bonding the first wafer to a second wafer to form a wafer stack.

29. The method of claim 28, further comprising:
thinning an opposing side of the first wafer to expose the conductive material within each of the vias.

30. The method of claim 29, further comprising performing alignment of the wafer stack using the exposed vias and conductive material.

31. The method of claim 29, further comprising depositing a layer of dielectric material over the opposing side of the first wafer and the exposed vias.

32. The method of claim 31, further comprising forming a number of other vias, each of the other vias extending through the dielectric layer and to the conductive material in one of the number of vias.

33. The method of claim 32, further comprising:
forming a number of trenches in the dielectric layer, each trench located coincident with one of the other vias; and depositing a conductive material in each of the other vias and each of the trenches, the conductive material in each of the trenches forming a land.

34. The method of claim 33, wherein the conductive material in each of the vias and the conductive material in each of the other vias comprises a copper material.

35. The method of claim 33, further comprising depositing a connection element on each of the lands.

36. The method of claim 33, further comprising continuing deposition of the conductive material to form connection elements proximate at least some of the trenches.

37. The method of claim 32, further comprising depositing a conductive material in each of the other vias.

38. The method of claim 37, wherein the conductive material in each of the vias and the conductive material in each of the other vias comprises a copper material.

39. The method of claim 37, further comprising continuing deposition of the conductive material to form connection elements proximate at least some of the other vias.

40. The method of claim 28, further comprising:
etching an opposing side of the first wafer to expose the layer of insulating material in each of the vias.

41. The method of claim 40, further comprising performing alignment of the wafer stack using the exposed vias and insulating material.

42. The method of claim 40, further comprising depositing a layer of dielectric material over the opposing side of the first wafer and the exposed insulating material.

43. The method of claim 42, further comprising forming a number of trenches in the dielectric layer and the exposed insulating material to expose the conductive material in the vias.

44. The method of claim 43, further comprising depositing a conductive material in each of the vias and each of the trenches.

45. The method of claim 44, wherein the conductive material in each of the trenches forms a land, the method further comprising depositing a connection element on each of the lands.

46. The method of claim 44, further comprising continuing deposition of the conductive material to form connection elements proximate at least some of the trenches.

47. The method of claim 28, wherein the insulating material comprises one of an oxide material, a nitride material, and a carbide material.

48. The method of claim 47, wherein the insulating material comprises one of $SiO_2$, $Si_3N_4$, and SiC.

49. The method of claim 28, further comprising cutting the wafer stack into a plurality of stacked die.

50. The method of claim 49, further comprising packaging one of the stacked die to form a packaged integrated circuit device.

51. The method of claim 28, further comprising forming at least one dummy via extending through the first interconnect structure and into the first wafer.

* * * * *

UNITED STATES PATENT AND TRADEMARK OFFICE
CERTIFICATE OF CORRECTION

Figure 1A:
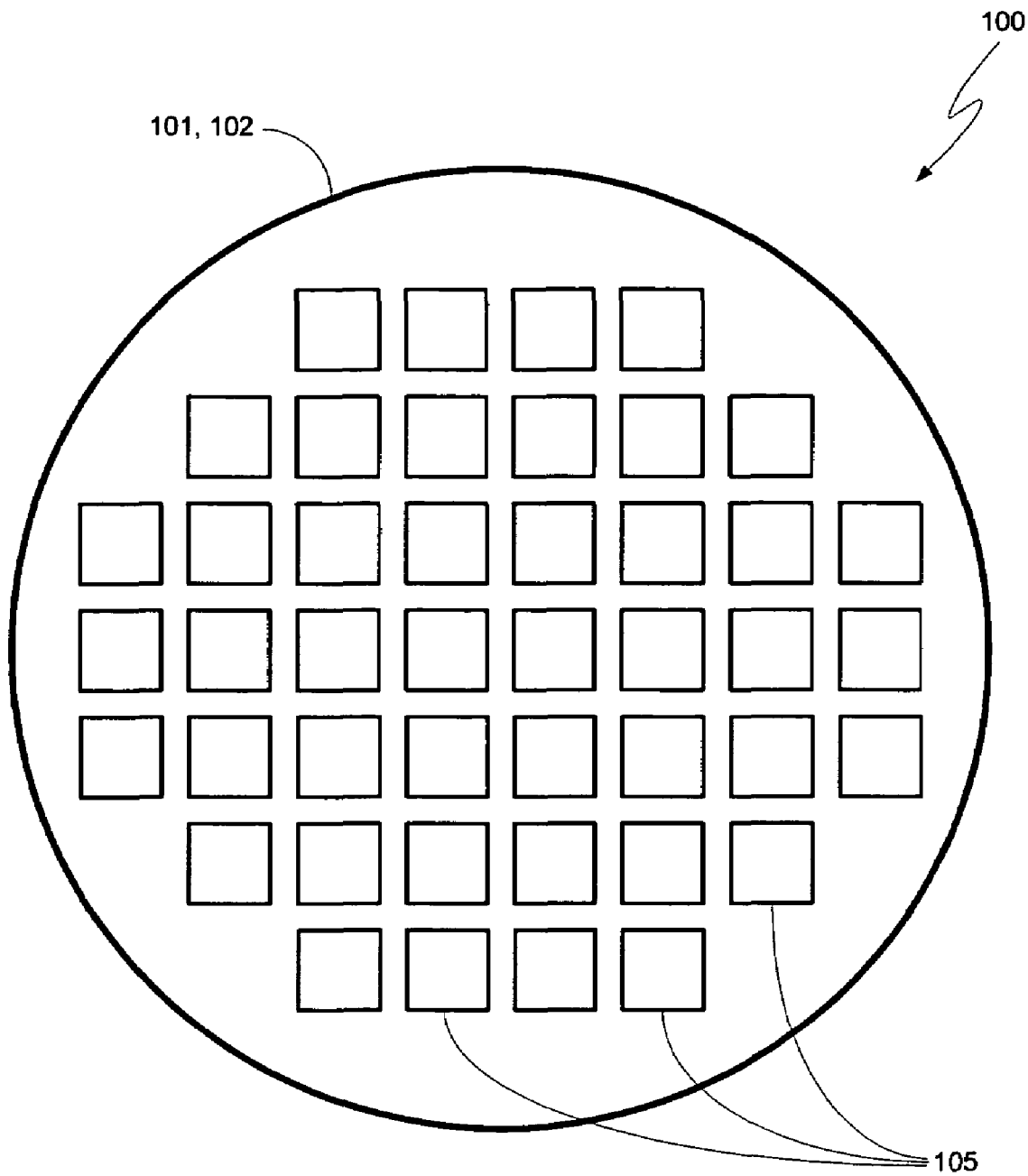
FIGS. 1A–1C are schematic diagrams illustrating an example of a conventional wafer stack.
Figure 1B:
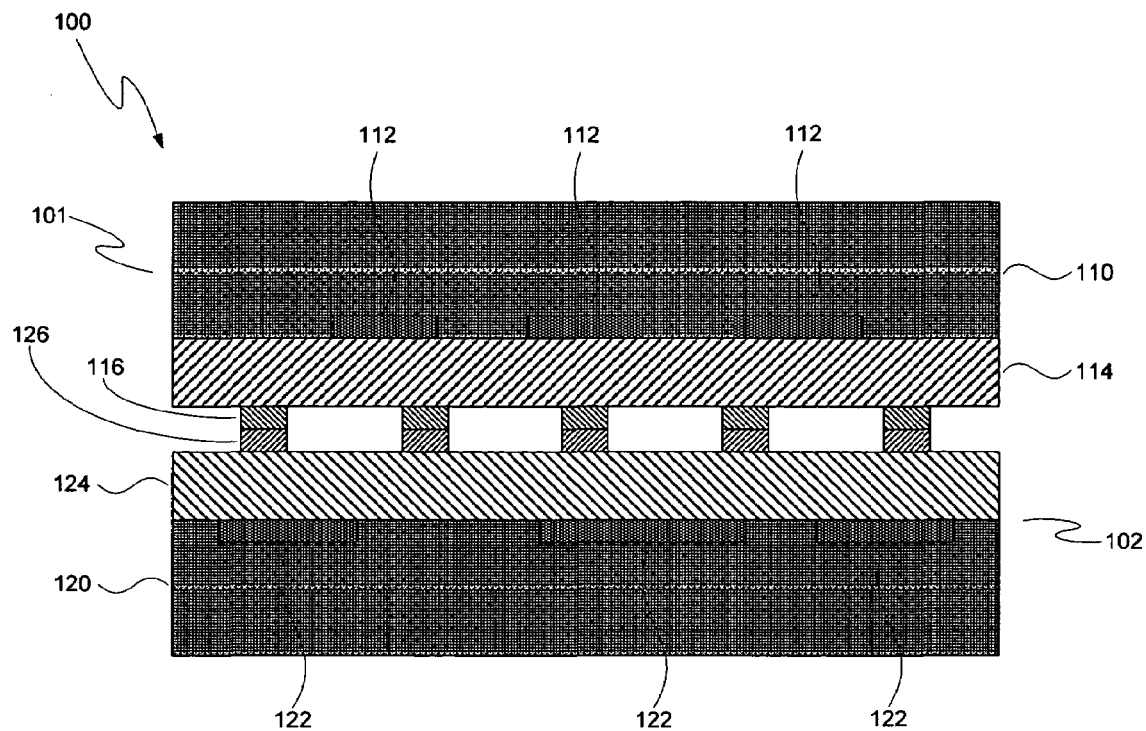
Figure 1C:
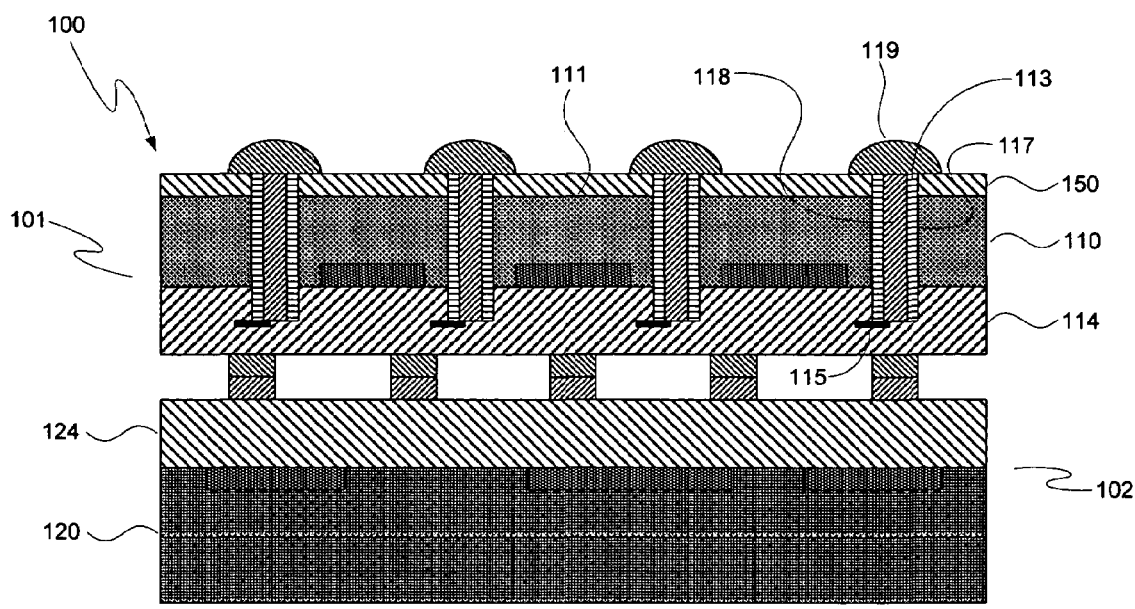

PATENT NO. : 7,056,813 B2  Page 1 of 1
APPLICATION NO. : 11/071434
DATED : January 2, 2007
INVENTOR(S) : Dodd It is certified that error appears in the above-identified patent and that said Letters Patent is hereby corrected as shown below:

In column 1, at line 36, delete "FIG. 11B." and insert --FIG. 1B.--.

Signed and Sealed this

Twentieth Day of January, 2009

JON W. DUDAS
*Director of the United States Patent and Trademark Office*

UNITED STATES PATENT AND TRADEMARK OFFICE
CERTIFICATE OF CORRECTION

PATENT NO. : 7,056,813 B2  Page 1 of 1
APPLICATION NO. : 11/071434
DATED : June 6, 2006
INVENTOR(S) : Patrick Morrow et al.

It is certified that error appears in the above-identified patent and that said Letters Patent is hereby corrected as shown below:

In column 1, at line 36, delete "FIG. 11B." and insert --FIG. 1B.--.

This certificate supersedes the Certificate of Correction issued January 20, 2009.

Signed and Sealed this

Seventeenth Day of February, 2009

JOHN DOLL
*Acting Director of the United States Patent and Trademark Office*